(12) United States Patent
Sakamoto et al.

(10) Patent No.: US 6,228,196 B1
(45) Date of Patent: May 8, 2001

(54) METHOD OF PRODUCING A MULTI-LAYER CERAMIC SUBSTRATE

(75) Inventors: Sadaaki Sakamoto, Shiga-ken; Hirofumi Sunahara, Moriyama; Mitsuyoshi Nishide, Shiga-ken, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/316,770

(22) Filed: May 21, 1999

(30) Foreign Application Priority Data

Jun. 5, 1998 (JP) .................................................. 10-157159
Jul. 21, 1998 (JP) .................................................. 10-204872

(51) Int. Cl.$^7$ .................................................... B32B 31/26
(52) U.S. Cl. ...................................... 156/89.17; 156/89.12; 156/89.18
(58) Field of Search .......................... 156/89.12, 89.14, 156/89.16, 89.17, 89.18, 289; 29/25.42, 851; 428/901; 361/320, 321.1, 321.2, 321.3, 301.3

(56) References Cited

U.S. PATENT DOCUMENTS

| | | | |
|---|---|---|---|
| 4,567,542 | * | 1/1986 | Shimada et al. . |
| 4,800,459 | * | 1/1989 | Takagi et al. . |
| 5,085,720 | * | 2/1992 | Mikeska et al. .................. 156/289 X |
| 5,130,067 | * | 7/1992 | Flaitz et al. . |
| 5,144,526 | * | 9/1992 | Vu et al. . |
| 5,370,759 | * | 12/1994 | Hakotani et al. ................. 156/289 X |
| 5,387,474 | * | 2/1995 | Mikeska et al. .................. 156/289 X |
| 5,456,778 | * | 10/1995 | Fukuta et al. . |
| 5,470,412 | * | 11/1995 | Fukuta et al. . |
| 5,655,209 | * | 8/1997 | Casy et al. . |
| 5,661,882 | * | 9/1997 | Alexander ........................... 29/25.42 |
| 5,708,570 | * | 1/1998 | Polinski, Sr. . |
| 5,814,366 | * | 9/1998 | Fukuta et al. .................. 156/89.11 X |
| 5,855,711 | * | 1/1999 | Araki et al. ....................... 156/89.16 |
| 5,876,538 | * | 3/1999 | Stenle et al. ..................... 156/89.16 |
| 6,042,667 | * | 3/2000 | Adachi et al. .................... 156/89.12 |
| 6,139,666 | * | 11/2000 | Fasano et al. . |
| 6,153,290 | * | 11/2000 | Sunahara . |

FOREIGN PATENT DOCUMENTS

| | | | |
|---|---|---|---|
| 0 535 711 | * | 4/1993 | (EP) . |
| 6-97661 | * | 4/1994 | (JP) . |
| 6-125171 | * | 5/1994 | (JP) . |
| 11-87918 | * | 3/1999 | (JP) . |

* cited by examiner

Primary Examiner—Curtis Mayes
(74) Attorney, Agent, or Firm—Ostrolenk, Faber, Gerb & Soffen, LLP

(57) ABSTRACT

The invention provides a method of producing a multi-layer ceramic substrate comprising a laminated member having a plurality of ceramic layers made of a ceramic insulating material and a wiring conductor, comprising the steps of: preparing a raw compact having the plurality of the laminated ceramic green sheets containing the ceramic insulating material and the wiring conductor; providing raw sheet type bases on the principal plane at both ends with respect to the lamination direction of the raw compact, the raw sheet type bases containing a ceramic not to be sintered at the baking temperature of the raw compact; baking the raw compact in the state interposed between the sheet type bases so as to obtain the laminated member; and eliminating the unsintered sheet type bases; wherein the heat expansion coefficient difference of the sheet type bases and the laminated member after baking is $2.5 \times 10^{-6}$ degK$^{-1}$ or more.

17 Claims, 7 Drawing Sheets

METHOD OF PRODUCING A MULTI-LAYER CERAMIC SUBSTRATE

BACKGROUND OF THE INVENTION

1. Field of the Invention

The present invention relates to a method of producing a multi-layer ceramic substrate. Specifically, it relates to a method of producing a multi-layer ceramic substrate to be adopted advantageously in the production of a multi-layer ceramic substrate accommodating a passive component such as a capacitor, an inductor, or the like.

2. Description of the Related Art

In order to realize multi-functions, a higher density, and a higher performance in a multi-layer circuit substrate represented by a multi-layer ceramic substrate, it is effective to store a sophisticated passive component and apply wiring with a high density in such a multi-layer circuit substrate.

Multi-layer circuit substrates storing a passive component accordingly have been produced conventionally by various methods as follows:

First one is a so-called thick film method where a dielectric paste, or the like, is printed on substrate green sheets by the thick film forming technology so that the green sheet can be laminated, pressed and baked for partially storing a capacitor, or the like, inside the multi-layer ceramic substrate. However, the method has the following problems:

(1) Due to comparatively large irregularity in the paste film thickness and printing displacement, the irregularity in the capacitor characteristics such as the capacity is comparatively large.

(2) Paste deformation generated in the pressing or baking step gives rise to the irregularity in the characteristics such as the capacity.

(3) Due to deterioration of the flatness in the printing part according to the repetition of printing and lamination, it is difficult to increase the number of the lamination so that a large capacity can hardly be achieved in a capacitor.

Second one is a method similar to the above-mentioned first method, for producing a multi-layer circuit substrate with a resistor and a capacitor where a capacitor, a resistor, or the like is printed on the surface of a ceramic substrate with a thick film forming technology in multi-layers. However, this method has the following problems substantially the same as those of the above-mentioned first method:

(1) Characteristics irregularity due to the printing pattern displacement and the film thickness irregularity, (2) Capacity limitation due to the difficulty in increasing the number of the lamination, and (3) Flatness deterioration.

Third one is a method of accommodating a dielectric member in a sheet form inside a multi-layer substrate as disclosed in the official gazette of Japanese Unexamined Patent Publication No. 59-17232. In this case, a dielectric sheet having the area the same as the substrate is laminated by being interposed between substrate sheets for the substrate, pressed, and baked. Accordingly, although problems including the characteristics irregularity such as capacity and limitation with respect to a larger capacity can be solved, the following problems come out:

(1) Since a laminated member containing plural kinds of sheets with different compositions is co-sintered, a highly sophisticated technology is required in controlling the contraction behavior and the heat expansion coefficient so as to be coincided in the baking step.

(2) Due to the layer arrangement of the dielectric members inside the substrate, the degree of freedom in design is low.

(3) Problems such as crosstalk of signals can easily be generated.

Methods for achieving high density wiring in a multi-layer circuit substrate include a method of pressing onto both upper and lower surfaces of a laminated member comprising a plurality of green sheets for the substrate to be baked at a low temperature, dummy green sheets not to be contracted at the baking temperature of the laminated member for a substrate, baking the same at a comparatively low temperature, peeling off and eliminating the unsintered layer derived from the latter dummy green sheets after baking (see the official gazette of Japanese Unexamined Patent Publication No. 4-243978), and a method of further pressing the laminated member for a substrate from above and below at the time of baking in the above-mentioned method (see the official gazette of Japanese Examined Patent Publication No. 5-503498).

Since contraction can hardly be generated in the substrate surface direction, that is, in the X-Y direction in these methods, the size accuracy of the substrate to be obtained can be improved. Therefore, it is advantageous in that disconnection can hardly be generated even if high density wiring is applied. However, the above-mentioned official gazettes does not disclose the accommodation of a passive component inside the substrate or a technology for facilitating the elimination of the dummy green sheet.

Again, as a fourth method for producing a multi-layer circuit substrate accommodating a passive component, for example, the official gazette of Japanese Unexamined Patent Publication No. 9-92983 discloses a method combining the above-mentioned method of preventing the substrate contraction in the X-Y direction, and the method of partially accommodating a capacitor inside a multi-layer circuit substrate as a sheet or a thick film. This method is suitable for producing a multi-layer circuit substrate accommodating a passive component with high density wiring.

Since a dielectric member layer having the area the same as the substrate is provided when the dielectric member part is formed with a sheet in the fourth method, the dielectric member layer is exposed on the substrate end face. A sufficient density is achieved in the dielectric member layer by pressing the substrate from above and below at the time of baking for the dielectric member layer needs to be dense in order to prevent moisture penetration. However, since the dielectric member layer shape is limited, as in the above-mentioned third method using a dielectric member sheet, problems come out in that:

(1) Due to the layer arrangement of the dielectric members inside the substrate, the degree of freedom in design is low.

(2) Problems such as crosstalk of signals can easily be generated.

On the other hand, when the dielectric member part is formed with a thick film in the fourth method, a step of filling a dielectric paste onto a concave part preliminarily provided in the substrate sheet corresponding to the area for forming the dielectric member part can be adopted. Although the problems of the thick film displacement and the characteristics irregularity derived from the dielectric paste deformation can be improved among the problems in the thick film method mentioned above as the first method, the paste film thickness irregularity can be improved but still remains and thus it is still insufficient. Furthermore, due to the difficulty of having the dielectric member part in a laminated structure, a problem of difficulty in obtaining a large capacity still remains.

The fourth method is advantageous in that the contraction in the substrate direction, that is, in the X-Y direction can be considerably smaller so that the contraction irregularity can be smaller accordingly and thus the size accuracy of the substrate can be comparatively high.

However, the fourth method requires the step of peeling off and eliminating the unsintered layer, which cannot contract at the baking temperature of the substrate after baking. If a step of abrasion or homing is needed for the peel-off, it results in the production cost rise therefor. In connection therewith, for example, the official gazette of Japanese Unexamined Patent Publication No. 9-266363 discloses a method of keeping and utilizing the part with a glass component discharged from the substrate surface from the unsintered layer fixed as the substrate surface without peeling off, but in this case, the peeling off step is needed. Moreover, the official gazette of Japanese Unexamined Patent Publication No. 5-136572 discloses a method of utilizing the unsintered layer as the substrate surface by filling the unsintered layer with an organic resin by soaking the same in the organic resin without peeling off or eliminating. In this case, a step of filling with the organic resin is required.

SUMMARY OF THE INVENTION

To overcome the above described problems, the present invention provides a method of producing a multi-layer ceramic substrate, accommodating a passive component, capable of achieving multi-functions, a higher density and a higher accuracy.

A first aspect of the present invention provides a method of producing a multi-layer ceramic substrate comprising a laminated member having a plurality of ceramic layers made of a ceramic insulating material and a wiring conductor for solving the above-mentioned technological problems, comprising a step of preparing a raw compact having the plurality of the laminated ceramic green sheets containing the ceramic insulating material and the wiring conductor, a step of providing raw sheet type bases containing a ceramic not to be sintered at the baking temperature of the raw compact on the principal plane at both ends with respect to the lamination direction of the raw compact, a step of baking the raw compact in the state interposed between the sheet type bases so as to obtain the laminated member, and a step of eliminating the unsintered sheet type bases, wherein the heat expansion coefficient difference of the sheet type bases and the laminated member after baking is $2.5 \times 10^{-6}$ degK$^{-1}$ or more.

In the above-mentioned method of producing a multi-layer ceramic substrate, preferably the compact is baked at a temperature not more than 1,000° C.

In addition to the first aspect of the present invention, second and third aspects of the present invention provide methods of producing a multi-layer ceramic substrate comprising a laminated member having a plurality of ceramic layers made of a ceramic insulating material and a wiring conductor, and a passive component wired by the wiring conductor and stored in the laminated member.

The second aspect of the present invention provides a method of producing a multi-layer ceramic substrate comprising a step of preparing a raw composite compact having a plurality of laminated first ceramic green sheets containing the ceramic insulating material and a second ceramic green sheet containing a raw ceramic functional material to be the passive component, which is different from the ceramic insulating material, arranged between the first ceramic green sheets, a step of arranging raw sheet type bases containing a raw ceramic not to be sintered at the baking temperature of the raw composite compact on the principal plane at both ends with respect to the lamination direction of the raw composite compact, a step of baking the raw composite compact being interposed by the sheet type bases so as to obtain the laminated member storing the passive component, and a step of eliminating the unsintered sheet type bases, wherein the heat expansion coefficient difference of the sheet type bases and the laminated member after baking is $2.5 \times 10^{-6}$ degK$^{-1}$ or more.

The third aspect of the present invention provides a method of producing a multi-layer ceramic substrate comprising a step of preparing a compact block including a raw ceramic functional material to be the passive component, which is different from the ceramic insulating material, a step of preparing a raw composite compact having a plurality of laminated ceramic green sheets containing the ceramic insulating material and the wiring conductor, preliminarily provided with a space in the inside such that the compact block is fitted into the space, a step of arranging sheet type bases made from a raw ceramic not to be sintered at the baking temperature of the raw composite compact on the principal plane at both ends with respect to the lamination direction of the raw composite compact, a step of baking the raw composite compact being interposed by the sheet type bases so as to obtain the laminated member storing the passive component, and a step of eliminating the unsintered sheet type bases, wherein the heat expansion coefficient difference of the sheet type bases and the laminated member after baking is $2.5 \times 10^{-6}$ degK$^{-1}$ or more.

Also in the above-mentioned second and third aspects of the present invention, preferably the composite compact is baked at a temperature not more than 1,000° C.

In the second or third aspects of the present invention, the second ceramic green sheet or the compact block provides, for example, a capacitor or an inductor when sintered. It is not limited to the capacitor or the inductor, but can be other functional element. Moreover, it is not limited to a single member functional element, but can be a composite functional element, such as an LC composite part combining a capacitor and an inductor.

Moreover, it is preferable that the above-mentioned second ceramic green sheet or the compact block has a laminated structure comprising a multi-layer internal conductor.

In this case, it is preferable that the above-mentioned internal conductor contains at least one selected from the group consisting of Ag, Ag—Pt alloy, Ag—Pd alloy, Au, and Cu as the main component.

Furthermore, it is preferable that the ceramic functional material contained in the second ceramic green sheet or the compact block contains a crystallized glass or a mixture of a glass and a ceramic.

Moreover, in the first, second and third aspects of the present invention, it is preferable that the ceramic insulating material contains a crystallized glass or a mixture of a glass and a ceramic, with the weight ratio of the glass/the ceramic selected in a range from 100/0 to 5/95.

Furthermore, in the first, second and third aspects of the present invention, it is preferable that the sheet type bases contain at least one oxide or composite oxide selected from the group consisting of $Al_2O_3$, MgO, CaO, $SiO_2$, BaO, $ZrO_2$, and $CeO_2$ as a ceramic.

Moreover, in the first, second and third aspects of the present invention, it is preferable that the wiring conductor contains at least one selected from the group consisting of Ag, Ag—Pt alloy, Ag—Pd alloy, Au, and Cu as the main component.

Furthermore, in the first, second and third aspects of the present invention, it is preferable that a load of not more than 10 kg/cm$^2$ is applied on the sheet type bases one-axially in the step of baking the raw compact or in the step of baking the raw composite compact.

Moreover, in the first, second and third aspects of the present invention, it is preferable that the step of eliminating the sheet type bases is conducted by peeling off the sheet type bases from the laminated member by utilizing the stress between the sheet type bases and the laminated member derived from the heat expansion coefficient difference in the temperature fall process after the baking step.

According to the first, second and third aspects of the present invention, since the raw compact or composite compact is baked with the sheet type bases comprising a raw ceramic not to be sintered at the baking temperature of the raw compact or composite compact arranged on the principal plane at both ends with respect to the lamination direction of the raw compact or composite compact, substantial contraction cannot be generated in the sheet type bases in the baking step so that the contraction in the X-Y direction of the compact or composite compact interposed by the sheet type bases can be restrained at the time of baking. Accordingly, the size accuracy of the multi-layer ceramic substrate can be further improved, and problems such as disconnection can be prevented even with minute high density wiring.

Moreover, according to the first, second and third aspects of the present invention, since the heat expansion coefficient difference between the sheet type bases and the laminated member after baking is $2.5 \times 10^{-6}$ degK$^{-1}$ or more, stress derived from the heat expansion coefficient advantageously functions for the peel-off of the sheet type bases so that the sheet type bases can be eliminated easily.

When the sheet type bases are eliminated as mentioned above, by peeling off the sheet type bases from the laminated member by utilizing the temperature fall process after baking and functioning the stress derived from the heat expansion coefficient difference between the sheet type bases and the laminated member in the temperature fall process, the sheet type bases can be eliminated efficiently.

If the present invention is adopted in the production of a multi-layer ceramic substrate comprising a passive component to be stored in a laminated member, a second ceramic green sheet or a compact block containing a raw ceramic functional material is provided as the passive component in addition to the first ceramic green sheets containing a ceramic insulating material comprising the laminated member. According to the first, second and third aspects of the present invention, since the contraction in the X-Y direction is restrained in baking the composite compact containing the second ceramic green sheet or the compact block as mentioned above, the contraction behavior of the second ceramic green sheet or the compact block and the first ceramic green sheets can be coincided more easily. Therefore, the materials for the second ceramic green sheet or the compact block and the first ceramic green sheets can be selected form a wider range.

Furthermore, if a multi-layer ceramic substrate storing a passive component is produced according to the present invention as mentioned above, since the passive component can be obtained by sintering integrally with the laminated member at the same time, the characteristics of the passive component itself can be determined substantially in the raw stage. Moreover, the potential characteristics in the raw stage can be maintained substantially after sintering. Therefore, the characteristics of the passive component to be accommodated in the multi-layer ceramic substrate can be obtained easily as designed. For that, the multi-layer ceramic substrate as a whole can be supplied with a stable quality. Accordingly, a multi-layer ceramic substrate with multi-functions, a higher density, a higher accuracy and a higher performance can be produced easily.

Moreover, in the first, second and third aspects of the present invention, if the above-mentioned passive component is provided as a compact block buried inside the laminated member, since the passive component is in the state of being completely buried inside the laminated member, a multi-layer ceramic substrate with a high environmental resistance such as the moisture resistance, or the like, can be obtained.

Furthermore, in the first, second and third aspects of the present invention, if the passive component is provided as the compact block as mentioned above, since the passive component can easily be disposed three-dimensionally in the multi-layer ceramic substrate, the degree of freedom in designing can be higher as well as problems such as crosstalk of signals can be avoided advantageously.

Moreover, in the first, second and third aspects of the present invention, if the passive component is provided as the compact block, since a raw composite compact with the raw compact block buried therein is baked, compared with the case of baking in the state with a preliminarily baked passive component buried therein, the need of strictly administrating the contraction behavior at the time of baking can be eliminated, and thus the selection range of the material to be used in a ceramic green sheet to be the laminated member can be widened.

Furthermore, in the first, second and third aspects of the present invention, since a space for fitting the compact block is provided preliminarily when the passive component is provided as the compact block, the flatness of the obtained multi-layer ceramic substrate can be maintained preferably. Therefore, since undesired deformation or disconnection of the wiring conductor can be prevented also in this point, high density wiring can be achieved with a high size accuracy while preventing the generation of the characteristics irregularity. And moreover, the number of layers of the ceramic layers comprising the multi-layer ceramic substrate can be increased without trouble. As a result, a higher performance of the multi-layer ceramic substrate can be achieved easily.

Moreover, in the first, second and third aspects of the present invention, when the passive component is provided as the second ceramic green sheet or the compact block, a capacitor of an inductor can be provided easily by the second ceramic green sheet or the compact block.

Furthermore, if the above-mentioned second ceramic green sheet or the compact block has a laminated structure for forming a multi-layer internal conductor, for example, a high capacity can be obtained when the passive component is a capacitor, and a high inductance can be obtained when the passive component is an inductor.

In the first, second and third aspects of the present invention, if the ceramic functional material contained in the second ceramic green sheet or the compact block contains a crystallized glass or a mixture of a glass and a ceramic, or if the ceramic insulating material contained in the ceramic green sheets comprising the compact or the composite compact to be the laminated member contains a glass or a mixture of a glass and a ceramic, with the weight ratio of the glass/the ceramic in a range from 100/0 to 5/95, the sintering process can be conducted at a comparatively low temperature such as 1,000° C.

Therefore, as a wiring conductor and an internal conductor, one containing at least one selected from the group consisting of Ag, Ag—Pt alloy, Ag—Pd alloy, Au, Ni and Cu as the main component can be used without a trouble. Besides, as a ceramic for the above-mentioned sheet type bases, at least one oxide or composite oxide selected from the group consisting of $Al_2O_3$, MgO, CaO, $SiO_2$, BaO, $ZrO_2$, and $CeO_2$, which can be obtained comparatively easily and are chemically stable, can be used.

Moreover, since a load of not more than 10 $kg/cm^2$ is applied on the sheet type bases one-axially in the baking step included in the present invention, generation of undesired deformation such as warpage in the obtained multi-layer ceramic substrate in the baking step can be avoided advantageously.

[0015]
[Means for Solving the Problems]

A fourth aspect of the present invention provides a method of producing a multi-layer ceramic substrate comprising a laminated member having a plurality of ceramic layers made of a ceramic insulating material and a wiring conductor, comprising the steps of: preparing a plurality of ceramic green sheets containing the ceramic insulating material; preparing at least one raw sheet type base containing a ceramic not to be sintered at the baking temperature of the ceramic green sheets and having a sufficient thickness such that the filling a gap part by the penetration of a material comprising the ceramic green sheets part does not finish at the lowest temperature for completely sintering the ceramic green sheets when being baked in the state contacting with the ceramic green sheets; producing a raw composite compact comprising the plurality of the laminated ceramic green sheets, the raw sheet type base to be disposed in the state contacting with at least one of the ceramic green sheets, and the wiring conductor, by using the ceramic green sheets and the raw sheet type base; and baking the raw composite compact at a temperature higher than the lowest sintering temperature of the ceramic green sheets such that the gap part of the sheet type bases is filled completely with the material comprising the ceramic green sheets so as to obtain the laminated member.

In addition to the above described fourth aspect of the present invention, the fifth and sixth aspects of the present invention are also oriented to a method of producing a multi-layer ceramic substrate comprising a laminated member having a plurality of ceramic layers made of a ceramic insulating material and a wiring conductor, and a passive component wired by the wiring conductor and stored in the laminated member.

The fifth aspect of the present invention provides a method of producing a multi-layer ceramic substrate comprising a laminated member having a plurality of ceramic layers made of a ceramic insulating material and a wiring conductor, comprising the steps of: preparing a plurality of ceramic green sheets containing the ceramic insulating material; preparing at least one raw sheet type base containing a ceramic not to be sintered at the baking temperature of the ceramic green sheets and having a sufficient thickness such that the filling a gap part by the penetration of a material comprising the ceramic green sheets part does not finish at the lowest temperature for completely sintering the ceramic green sheets when being baked in the state contacting with the ceramic green sheets; producing a raw composite compact comprising the plurality of the laminated ceramic green sheets, the raw sheet type base to be disposed in the state contacting with at least one of the ceramic green sheets, and the wiring conductor, by using the ceramic green sheets and the raw sheet type base, and baking the raw composite compact at a temperature higher than the lowest sintering temperature of the ceramic green sheets such that the gap part of the sheet type bases is filled completely with the material comprising the ceramic green sheets so as to obtain the laminated member.

The sixth aspect of the present invention provides a method of producing a multi-layer ceramic substrate comprising a laminated member having a plurality of ceramic layers made of a ceramic insulating material and a wiring conductor, and a passive component wired by the wiring conductor and stored in the laminated member, comprising the steps of: preparing a plurality of ceramic green sheets containing the ceramic insulating material and a compact block containing a raw ceramic functional material to be the passive component, which is different from the ceramic insulating material, preparing at least one raw sheet type base containing a ceramic not to be sintered at the baking temperature of the ceramic green sheets and the compact block and having a sufficient thickness such that the filling a gap part by the penetration of a material comprising the ceramic green sheets part does not finish at the lowest temperature for completely sintering the ceramic green sheets when being baked in the state contacting with the ceramic green sheets; producing a raw composite compact comprising the plurality of the laminated ceramic green sheets, the raw sheet type base to be disposed in the state contacting with at least one of the ceramic green sheets, and the wiring conductor, by using the ceramic green sheets, the raw sheet type base and the compact block; and baking the raw composite compact at a temperature higher than the lowest sintering temperature of the ceramic green sheets such that the gap part of the sheet type base is filled completely with the material comprising the ceramic green sheets so as to obtain the laminated member.

In the fifth or sixth aspect of the present invention, the second ceramic green sheet or the compact block provides, for example, a capacitor or an inductor when sintered. It is not limited to the capacitor or the inductor, but can be other functional element. Moreover, it is not limited to a single member functional element, but can be a composite functional element, such as an LC composite part combining a capacitor and an inductor.

Moreover, it is preferable that the above-mentioned second ceramic green sheet or the compact block has a laminated structure comprising a multi-layer internal conductor.

In this case, it is preferable that the above-mentioned internal conductor contains at least one selected from the group consisting of Ag, Ag—Pt alloy, Ag—Pd alloy, Au, and Cu as the main component.

Furthermore, it is preferable that the ceramic functional material contained in the second ceramic green sheet or the compact block contains a crystallized glass or a mixture of a glass and a ceramic.

Moreover, in the fourth, fifth and sixth aspects of the present invention, the sheet type base can be disposed either at both ends with respect to the lamination direction of the composite compact, at the center part with respect to the lamination direction of the composite compact, or at both ends and the center part with respect to the lamination direction of the composite compact.

Furthermore, in the fourth, fifth and sixth aspects of the present invention, it is preferable that the composite compact is baked at a temperature not more than 1,000° C.

In this case, it is preferable that the ceramic insulating material contains a crystallized glass or a mixture of a glass and a ceramic, with the weight ratio of the glass/the ceramic selected in a range from 100/0 to 5/15.

Moreover, in the above-mentioned case, it is preferable that the sheet type base contains at least one selected from the group consisting of alumina and zirconia as a ceramic.

Furthermore, in the fourth, fifth and sixth aspects of the present invention, it is preferable that the wiring conductor contains at least one selected from the group consisting of Ag, Ag—Pt alloy, Ag—Pd alloy, Au, and Cu as the main component.

Moreover, in the fourth, fifth and sixth aspects of the present invention, it is preferable that a load of not more than 10 kg/cm$^2$ is applied in the lamination direction in the step of baking the raw composite compact.

Furthermore, in the laminated member obtained by the baking step included in the fourth, fifth and sixth aspects of the present invention, it is preferable that the heat expansion coefficient of the sheet type base part is smaller than the heat expansion coefficient of the ceramic layer part by not less than $0.5 \times 10^{-6}$ degK$^{-1}$ but not more than $4.5 \times 10^{-6}$ degK$^{-1}$.

According to the fourth, fifth and sixth aspects of the present invention, in the raw composite compact to be baked, the raw sheet type base is disposed in the state contacting with at least one ceramic green sheet. The raw sheet type base contains a ceramic not to be sintered at the baking temperature of the ceramic green sheet and has a thickness sufficient for not having the gap part being completely filled by the penetration of the material comprising the ceramic green sheet at the lowest temperature for completely sintering the ceramic green sheet. The raw composite laminated member is baked at a temperature higher than the lowest sintering temperature of the ceramic green sheet such that the gap part of the sheet type base is filled completely with the material comprising the ceramic green sheet.

Therefore, substantial contraction cannot be generated in the sheet type base in the baking step so that the contraction in the X-Y direction of the composite compact can be restrained at the time of baking. As a result, the size accuracy of the multi-layer ceramic substrate can be further improved, and problems such as disconnection can be prevented even with minute high density wiring.

Moreover, since the sheet type base becomes dense after baking, it can be used as a member comprising a part of the multi-layer ceramic substrate as it is. Therefore, the labor of eliminating the sheet type base afterwards can be saved.

In these aspects of the present invention, when the sheet type base is disposed at both ends with respect to the lamination direction of the composite compact, a higher contraction restraining effect can be expected with a smaller number of sheet type bases. Moreover, when the sheet type base is disposed at the center part with respect to the lamination direction of the composite laminated member, the contraction of the composite laminated member in the center part with respect to the thickness direction can be restrained effectively even if the composite laminated member has a large thickness. Furthermore, since the contraction restraining effect can be expected at plural parts in the composite compact with respect to the thickness direction if the sheet type base is disposed at both ends and the center part of the composite laminated member in the lamination direction, it is advantageous particularly when the composite compact has a large thickness.

If these aspects of the present invention are adopted in the production of a multi-layer ceramic substrate comprising a passive component to be stored in a laminated member, a second ceramic green sheet or a compact block containing a raw ceramic functional material is provided as the passive component in addition to the first ceramic green sheets containing a ceramic insulating material comprising the laminated member. According to the present invention, since the contraction in the X-Y direction is restrained in baking the composite compact containing the second ceramic green sheet or the compact block as mentioned above, the contraction behavior of the second ceramic green sheet or the compact block and the first ceramic green sheets can be coincided more easily. Therefore, the materials for the second ceramic green sheet or the compact block and the first ceramic green sheets can be selected form a wider range.

Furthermore, if a multi-layer ceramic substrate storing a passive component is produced according to these aspects of the present invention as mentioned above, since the passive component can be obtained by sintering integrally with the laminated member at the same time, the characteristics of the passive component itself can be determined substantially in the raw stage. Moreover, the potential characteristics in the raw stage can be maintained substantially after sintering. Therefore, the characteristics of the passive component to be accommodated in the multi-layer ceramic substrate can be obtained easily as designed. For that, the multi-layer ceramic substrate as a whole can be supplied with a stable quality. Accordingly, a multi-layer ceramic substrate with multi-functions, a higher density, a higher accuracy and a higher performance can be produced easily.

Moreover, in these aspects of the present invention, if the above-mentioned passive component is provided as a compact block buried inside the laminated member, since the passive component is in the state of being completely buried inside the laminated member, a multi-layer ceramic substrate with a high environmental resistance such as the moisture resistance, or the like, can be obtained.

Furthermore, in these aspects of the present invention, if the passive component is provided as the compact block as mentioned above, since the passive component can easily be disposed three-dimensionally in the multi-layer ceramic substrate, the degree of freedom in designing can be higher as well as problems such as crosstalk of signals can be avoided advantageously.

Moreover, in these aspects of the present invention, if the passive component is provided as the compact block, since a raw composite compact with the raw compact block buried therein is baked, compared with the case of baking in the state with a preliminarily baked passive component buried therein, the need of strictly administrating the contraction behavior at the time of baking can be eliminated, and thus the selection range of the material to be used in a ceramic green sheet to be the laminated member can be widened.

Furthermore, in these aspects of the present invention, since a space for fitting the compact block is provided preliminarily when the passive component is provided as the compact block, the flatness of the obtained multi-layer ceramic substrate can be maintained preferably. Therefore, since undesired deformation or disconnection of the wiring conductor can be prevented also in this point, high density wiring can be achieved with a high size accuracy while preventing the generation of the characteristics irregularity. And moreover, the number of layers of the ceramic layers comprising the multi-layer ceramic substrate can be increased without trouble. As a result, a higher performance of the multi-layer ceramic substrate can be achieved easily.

Moreover, in these aspects of the present invention, when the passive component is provided as the second ceramic green sheet or the compact block, a capacitor of an inductor can be provided easily by the second ceramic green sheet or the compact block.

Furthermore, if the above-mentioned second ceramic green sheet or the compact block has a laminated structure for forming a multi-layer internal conductor, for example, a high capacity can be obtained when the passive component is a capacitor, and a high inductance can be obtained when the passive component is an inductor.

In these aspects of the present invention, if the ceramic functional material contained in the second ceramic green sheet or the compact block contains a crystallized glass or a mixture of a glass and a ceramic, or if the ceramic insulating material contained in the ceramic green sheets comprising the compact or the composite compact to be the laminated member contains a glass or a mixture of a glass and a ceramic, with the weight ratio of the glass/the ceramic in a range from 100/0 to 5/95, the sintering process can be conducted at a comparatively low temperature such as 1,000° C.

Therefore, as a wiring conductor and an internal conductor, one containing at least one selected from the group consisting of Ag, Ag—Pt alloy, Ag—Pd alloy, Au, Ni and Cu as the main component can be used without a trouble. Besides, as a ceramic for the above-mentioned sheet type base, alumina or zirconia, which can be obtained comparatively easily and are chemically stable, can be used.

Moreover, since a load of not more than 10 kg/cm$^2$ is applied in the lamination direction of the composite compact in the baking step included in the present invention, generation of undesired deformation such as warpage in the obtained multi-layer ceramic substrate in the baking step can be avoided advantageously.

Furthermore, in the laminated member obtained by the baking step included in the present invention, with the heat expansion coefficient of the sheet type base part selected smaller than the heat expansion coefficient of the ceramic layer part by not less than $0.5 \times 10^{-6}$ degK$^{-1}$ but not more than $4.5 \times 10^6$ degK$^{-1}$, an appropriate compressive stress can be generated in the surface layer part of the obtained multi-layer ceramic substrate so that the mechanical strength of the multi-layer ceramic substrate can be improved by the compressive stress.

Other features and advantages of the present invention will become apparent from the following description of the invention which refers to the accompanying drawings.

DESCRIPTION OF PREFERRED EMBODIMENTS

Figure 1:
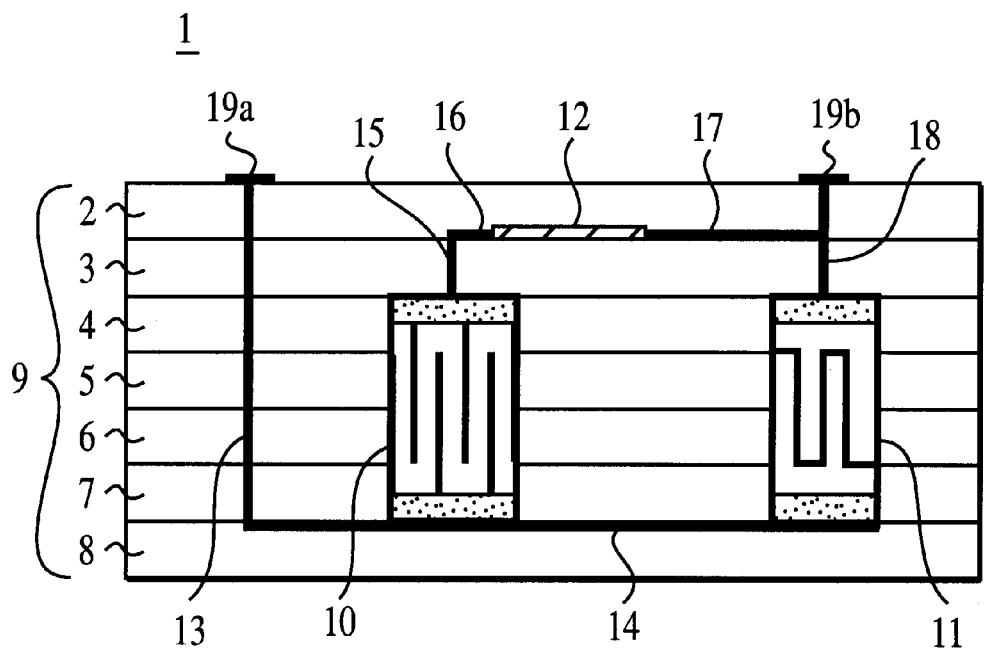
FIG. 1 is a schematic cross-sectional view of a multi-layer ceramic substrate 1 according to the first preferred embodiment of the present invention.
Figure 2:
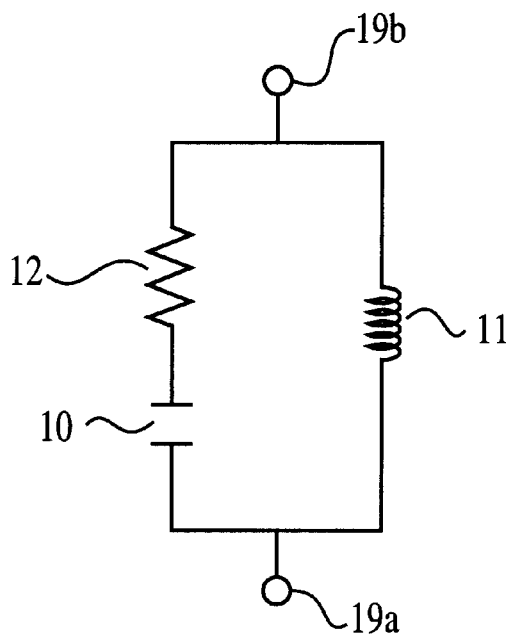
FIG. 2 is an equivalent circuit diagram to be provided by the multi-layer substrate 1 shown in FIG. 1.

FIG. 1 is a cross-sectional view schematically showing a multi-layer ceramic substrate 1 according to a first preferred embodiment of the present invention. FIG. 2 is an equivalent circuit diagram provided by the multi-layer substrate 1 shown in FIG. 1.

As shown in FIG. 1, the multi-layer ceramic substrate 1 comprises a laminated member 9 having a plurality of laminated ceramic layers made of a ceramic insulating material 2, 3, 4, 5, 6, 7 and 8. The laminated member 9 accommodates a capacitor 10, an inductor 11 and a resistor 12 as the passive components. Furthermore, the laminated member 9 accommodates wiring conductors 13, 14, 15, 16, 17 and 18 for wiring the capacitor 10, the inductor 11, and the resistor 12, and further, has external terminal conductors 19a and 19b on the outer surface. Accordingly, the multi-layer ceramic substrate 1 provides a circuit as shown in FIG. 2.

Figure 3:
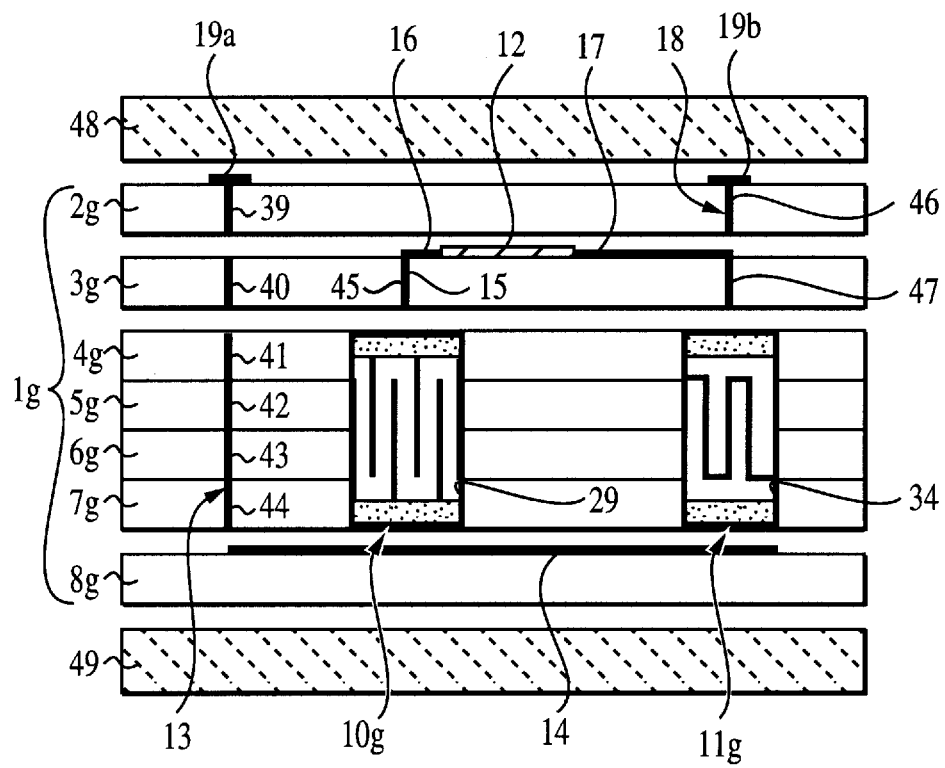
FIG. 3 is a cross-sectional view of ceramic green sheets 2g to 8g, compact blocks 10g and 11g, and sheet type bases 48 and 49 to be prepared for producing the multi-layer ceramic substrate 1, for explaining the method of producing the multi-layer ceramic substrate 1 shown in FIG. 1.
Figure 4:
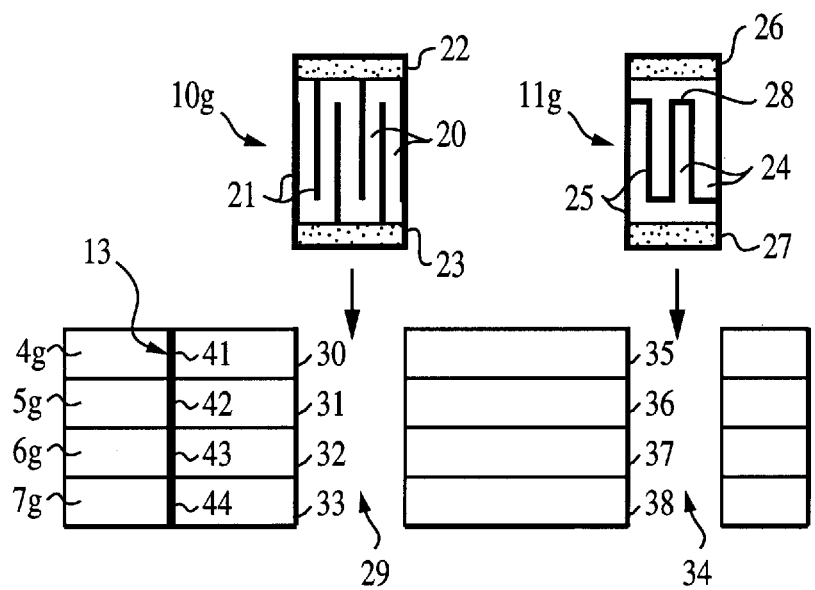
FIG. 4 is a cross-sectional view showing the ceramic green sheets 4g to 7g and the compact blocks 10g and 11g shown in FIG. 3 separately.

The multi-layer ceramic substrate 1 with the above-mentioned configuration can be produced as follows. FIG. 3 is a cross-sectional view for explaining the method of producing the multi-layer ceramic substrate 1 shown in FIG. 1. FIG. 4 is a cross-sectional view for explaining the method for obtaining a part of the elements shown in FIG. 3.

A compact block for a capacitor containing a raw ceramic functional material 10g to be the above-mentioned capacitor 10 and a compact block for an inductor containing a raw ceramic functional material 11g to be the inductor 11 are prepared, respectively.

The compact block for a capacitor 10g includes a ceramic dielectric member as the ceramic functional material so as to provide a laminated structure where multi-layer internal conductors 21 are formed via a raw dielectric sheet 20 containing the ceramic dielectric member. Terminal electrodes 22 and 23 are formed at end faces of the compact block 10 facing to each other. The internal electrodes 21 are provided such that ones to be connected with the terminal electrode 22 at one side and ones to be connected with the terminal electrode 23 at the other side are arranged alternately as in an internal electrode in a known laminated ceramic capacitor.

The compact block for an inductor 11g includes a ceramic magnetic member as the ceramic functional material so as to provide a laminated structure where multi-layer internal conductors 25 are formed via a raw magnetic sheet 24 including the ceramic magnetic member. Terminal electrodes 26 and 27 are formed at end faces of the compact block 11g facing to each other. The multi-layer internal electrodes 25 comprise a conductor path elongating in a coil-like manner while each of them is connected with a through conductor 28 for penetrating each magnetic sheet 24.

It is preferable that the compact blocks 10g and 11g can be baked at a temperature not higher than 1,000° C.

Accordingly, as the ceramic functional material to be contained in the dielectric sheet 20 and in the magnetic sheet 24, that is, as the ceramic dielectric member and the ceramic magnetic member, a crystallized glass or a mixture of a glass and a ceramic can be used advantageously. More specifically, as the dielectric sheet 20, one prepared by forming a ceramic slurry obtained by mixing powders of barium titanate containing a slight amount of a borosilicate glass and an organic vehicle into a sheet-like shape by a doctor blade method can be used. On the other hand, as the magnetic sheet 24, one prepared by forming a ceramic slurry obtained by mixing powders of nickel zinc ferrite containing a slight amount of a borosilicate glass and an organic vehicle into a sheet-like shape by a doctor blade method can be used.

As a conductor for forming the internal conductor 21, the terminal electrodes 22 and 23, the internal conductor 25, the terminal electrodes 26 and 27, and the through conductor 28, a conductive paste containing at least one selected from the group consisting of Ag, Ag—Pt alloy, Ag—Pd alloy, Au and Cu as the main component can be used advantageously.

The internal electrodes 21 and 25 can be formed by applying the above-mentioned conductive paste onto the dielectric sheet 20 and the magnetic sheet 24 with a predetermined pattern by screen printing.

In order to obtain the compact blocks 10g and 11g, it is preferable that a predetermined number of the dielectric sheets 20 where the internal conductor 21 is formed and a predetermined number of the magnetic sheets 24 where the internal conductor 25 is formed as mentioned above are laminated, and applied with a pressing step. In the pressing step, for example, a 200 kg/cm² pressure is applied by a hydraulic press.

On the other hand, the ceramic green sheets 2g, 3g, 4g, 5g, 6g, 7g and 8g to be the above-mentioned ceramic layers 2 to 8 are prepared. The ceramic insulating material to be contained in the ceramic green sheets 2g to 8g are different from the ceramic functional material to be contained in the above-mentioned compact block 10g or 11g.

Processing or treatment are preliminarily applied to the ceramic green sheets 2g to 8g for providing the compact block for a capacitor 10g and the compact block for an inductor 11g, and for providing the resistor 12, the wiring conductors 13 to 18, and the external terminal conductors 19a and 19b.

More specifically, a series of through holes 30, 31, 32 and 33 to be a space 29 for accommodating the compact block for a capacitor 10g, and a series of through holes 35, 36, 37 and 38 to be a space 34 for accommodating the compact block for an inductor 11g are provided preliminarily to the ceramic green sheets 4g, 5g, 6g and 7g.

Furthermore, a series of through holes 39, 40, 41, 42, 43 and 44 for providing the wiring conductor 13 are provided preliminarily to the ceramic green sheets 2g, 3g, 3g, 5g, 6g and 7g. A through hole 45 for providing the wiring conductor 15 is provided to the ceramic green sheet 3g. A series of through holes 46 and 47 for providing the wiring conductor 18 are preliminarily provided to the ceramic green sheets 2g and 3g. A conductive paste to be the wiring conductors 13, 15 and 18 is applied into the through holes 39 to 47.

A conductive paste to be the external terminal conductor 19a and 19b is applied to the ceramic green sheet 2g by screen printing such that the conductive paste can be connected with the conductive paste in the through holes 39 and 46.

A conductive paste to be the wiring conductors 16 and 17 is applied to the ceramic green sheet 3g by screen printing such that the conductive paste can be connected with the conductive paste in the through holes 45 and 47. A thick film resistor to be the resistor 12 is applied such that the conductive paste to be the wiring conductors 16 and 17 can be connected. As the resistor paste for forming the thick film resistor, a mixture of powders of lutetium oxide containing a slight amount of borosilicate glass and an organic vehicle can be used advantageously.

Moreover, a conductive paste to be the wiring conductor 14 is provided to the ceramic green sheet 8g by screen printing such that it is connected to the conductive paste inside the through hole 44 and is exposed in the spaces 29 and 34 when the ceramic green sheets 2g to 8g are laminated, that is, it can be connected with the terminal electrodes 23 and 27 of the compact blocks 10g and 11g.

As the conductive paste to be the above-mentioned wiring conductors 13 to 18 and the external terminal conductors 19a and 19b, one containing at least one selected from the group consisting of Ag, Ag—Pt alloy, Ag—Pd alloy, Au and Cu as the main component can be used advantageously.

As the ceramic insulating material to be contained in the ceramic green sheets 2g to 8g, one which can be baked at a temperature not more than 1,000° C. is preferably used. Examples thereof include a glass, and a mixture of a glass and a ceramic. In this case, the weight ratio of the glass/the ceramic can be selected in the range from 100/0 to 5/95 because a baking temperature becomes higher than 1,000° C. with a glass/ceramic weight ratio smaller than 5/95. Since a higher baking temperature narrows the range of selecting the material for the above-mentioned wiring conductor 13 to 18, it is not preferable.

More specifically, as the ceramic green sheets 2g to 8g, one prepared by forming a ceramic slurry obtained by mixing borosilicate glass powders and alumina powders with an organic vehicle in a sheet-like shape by a doctor blade method can be used. The ceramic green sheets 2g to 8g of the material can be baked at a comparatively low temperature of about 800 to 1,000° C.

With the compact blocks 10g and 11g, and the ceramic green sheets 2g to 8g accordingly obtained, a raw composite compact 1g to be the multi-layer ceramic substrate 1 after baking can be produced as follows.

As shown in FIG. 4, the ceramic green sheets are laminated preliminarily. The, the compact blocks 10g and 11g are fitted into the spaces 29 and 34. At the time, the terminal electrodes 22, 23, 26 and 27 are exposed from the opening of the spaces 29 and 34. Then, a pressing step is conducted with, for example, a 500 kg/cm² hydraulic press so as to press the ceramic green sheets 4g to 7g. Accordingly, the closeness among the ceramic green sheets 4g to 7g can be improved as well as the compact blocks 10g and 11g and the internal periphery surface of the spaces 29 and 34 can be contacted closely.

The ceramic green sheets 2g, 3g and 8g are laminated above and below the above-mentioned ceramic green sheets 4g to 7g so as to obtain the raw composite compact 1g. In the state of the composite compact 1g, the conductive paste inside the through holes 39 to 44 forms a series of the wiring conductor 13 and is connected to the wiring conductor 14. The conductive paste in the through hole 45 is connected to the terminal electrode 22 of the compact block 10g. The conductive paste in the through holes 46 and 47 forms a series of the wiring conductor 18 and is connected to the terminal electrode 26 of the compact block 11g. The terminal electrodes 23 and 27 of the compact blocks 10g and 11g are connected to the wiring conductor 14.

In this embodiment, sheet type bases 48 and 49 made from a raw ceramic, which cannot be sintered at the baking temperature of the raw composite compact 1g, are further prepared. Since the raw composite compact 1g can be baked at a temperature not more than 1,000° C. as long as its components, the compact blocks 10g and 11g and the ceramic green sheets 2g to 8g can be baked at a temperature not more than 1,000° C. as mentioned above, a material which cannot be sintered at 1,000° C. can be used for the sheet type bases 48 and 49. The sheet type bases 48 and 49 can be obtained advantageously by forming a ceramic slurry obtained by mixing ceramic powders containing at least one oxide or composite oxide selected from the group consisting of $Al_2O_3$, MgO, CaO, $SiO_2$, BaO, $ZrO_2$, and $CeO_2$, and an organic vehicle into a sheet-like shape by a doctor blade method.

Since the above-mentioned sheet type bases 48 and 49 will be eliminated by peeling off from the laminated member 9 for the multi-layer substrate 1 after baking as descried later, it is effective to have a difference in heat expansion coefficient with respect to the laminated member 9 sintered by baking in order to facilitate the elimination by peel-off.

In this embodiment, the sheet type bases 48 and 49 become porous in the baking step and the glass contained in the composite compact 1g penetrates to the inside of the porous structure so as to be dense, but in a temperature range lower than the strain point of the glass, stress derived from the heat expansion coefficient difference between the laminated member 9 and the sheet type bases 48 and 49 after baking functions in the temperature fall process after baking. It was found out by an experiment that with a heat expansion coefficient difference provided by $2.5 \times 10^{-6}$ degK$^{-1}$ or more in average between the strain point of the glass and the room temperature, the stress derived from the heat expansion coefficient difference advantageously destroys the porous sheet type bases 48 and 49 so that the sheet type bases 48 and 49 can be peeled off from the laminated member 9 naturally.

As shown in FIG. 3, the above-mentioned sheet type bases 48 and 49 are arranged on the principal planes at both ends of the raw composite compact 1g with respect to the lamination direction, that is, on the upper and lower principal planes. Then, the raw composite compact 1g is pressed with the sheet type bases 48 and 49. For the pressing operation, for example, a 1,000 kg/cm$^2$ hydraulic press can be used.

The raw composite compact 1g is baked, for example, in the air at 900° C. while being interposed between the raw sheet type bases 48 and 49. It is preferable to apply a load of 10 kg/cm or not more than 10 kg/cm$^2$ one-axially in the baking step by placing a plate-like weight on the sheet type base 48 provided above because undesired deformation of the laminated member 9 or the multi-layer ceramic substrate 1 to be obtained such as warpage can be avoided advantageously by the load in the baking step. Since the effect of a load more than 10 kg/cm$^2$ is substantially the same as the case of a 10 kg/cm$^2$ load, a load more than 10 kg/cm$^2$ is not necessary.

By the baking operation, the compact blocks 10g and 11g are baked so as to be the capacitor 10 and the inductor 11 in the sintered state, and the ceramic green sheets 2g to 8g are baked so as to be the laminated member 9 having a plurality of ceramic layers 2 to 8 in the sintered state. Accordingly, a multi-layer ceramic substrate 1 in the sintered state as a whole can be obtained.

Moreover, in the sheet type bases 48 and 49, as mentioned above, since a stress derived from the heat expansion coefficient difference of $2.5 \times 10^{-6}$ degK$^{-1}$ or more functions between the laminated member 9 and the porous sheet type bases 48 and 49 after baking, in the temperature range of the strain point of the glass or less in the temperature fall process after baking. According to the stress, the porous sheet type bases 48 and 49 can be destroyed advantageously so that the sheet type bases 48 and 49 can be peeled off from the laminated member 9 naturally. Therefore, a desired multi-layer ceramic substrate 1 can be taken out easily and efficiently.

The above-mentioned sheet type bases 48 and 49 do not generate substantial contraction in the baking step. Therefore, the contraction of the composite compact 1g interposed between the sheet type bases 48 and 49 in the X-Y direction, that is, in the principal plane direction of the ceramic green sheets 2g to 8g can be advantageously restrained at the time of baking. Therefore, a higher size accuracy of the multi-layer ceramic substrate 1 can be achieved, and thus problems such as disconnection can further be prevented even if minute high density wiring is applied to the wiring conductors 13 to 18. According to an experiment, it was confirmed that the capacitor 10, the inductor 11 and the resistor 12 show the designed characteristics.

Furthermore, as mentioned above, since the contraction is restrained in the X-Y direction, the contraction behavior of the compact blocks 10g and 11g and the ceramic green sheets 2g to 8g can be coincided with each other more easily at the time of baking the compact blocks 10g and 11g and the ceramic green sheets 2g to 8g at the same time in baking the composite compact 1g. Therefore, the materials for the compact blocks 10g and 11g and the ceramic green sheets 2g to 8g can be selected from a further wider range.

Although the present invention has been explained with reference to the embodiment shown in the drawings, various modification can be adopted within the range of the invention.

For example, the circuit design adopted in the multi-layer ceramic substrate 1 shown in the drawings is merely a typical example for facilitating understanding of the present invention, and thus the present invention can be adopted equally in multi-layer ceramic substrates having various kinds of circuit designs.

Moreover, the compact blocks are not limited to a single member of a capacitor or an inductor, but a compact block of LC composite parts can be used as well.

Furthermore, although the spaces 29 and 34 for fitting the compact blocks 10g and 11g are provided as the through holes 30 to 33 and 35 to 38 in the ceramic green sheets 4g to 7g in the above-mentioned embodiment, a space for fitting a compact block can be formed as a concave part provided in a specific ceramic green sheet depending upon the size or the shape of the compact block.

Moreover, although the passive components 10 and 11 stored in the laminated member 9 are provided by the compact blocks 10g and 11g containing a raw ceramic functional material, respectively, and the compact blocks 10g and 11g are fitted into the spaces 29 an 34 preliminarily provided in the raw composite compact 1g in the illustrated method of producing a multi-layer ceramic substrate 1, a passive component can be provided by a second ceramic green sheet containing a ceramic functional material, which is different from the ceramic insulating material, to be interposed between the laminated first ceramic green sheets containing the ceramic insulating material.

Furthermore, the present invention can be adopted advantageously also to a method of producing a multi-layer ceramic substrate comprising a laminated member, simply with a wiring conductor formed therein, without storing the above-mentioned passive component.

Figure 5:
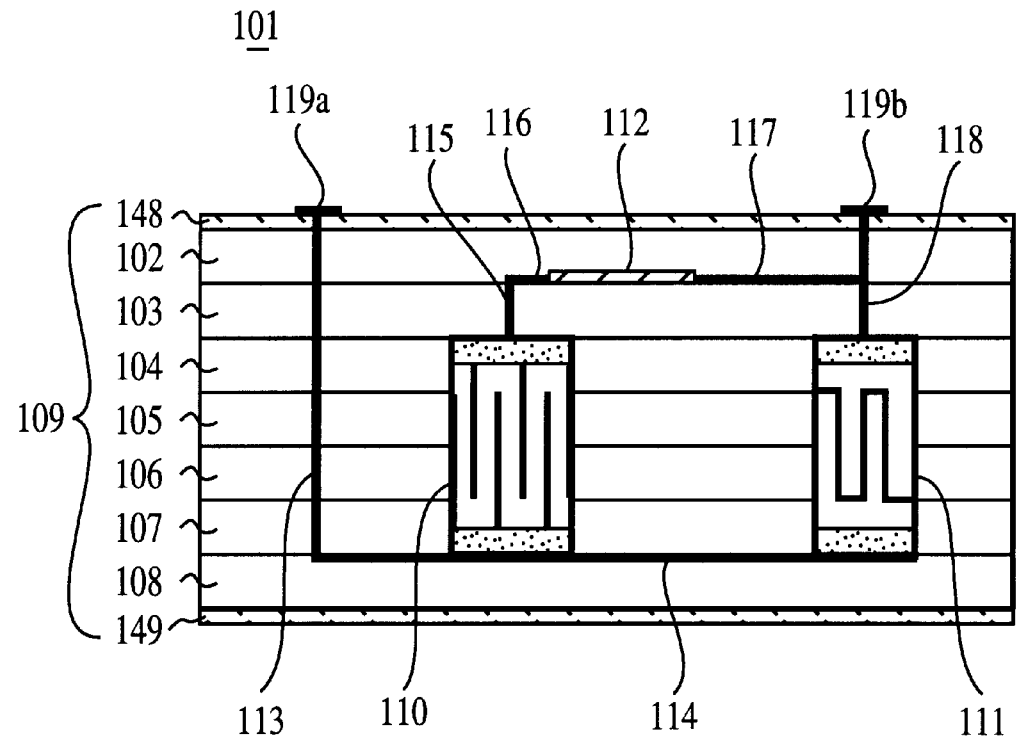
FIG. 5 is a schematic cross-sectional view of a multi-layer ceramic substrate 101 according to a second preferred embodiment of the present invention.
Figure 6:
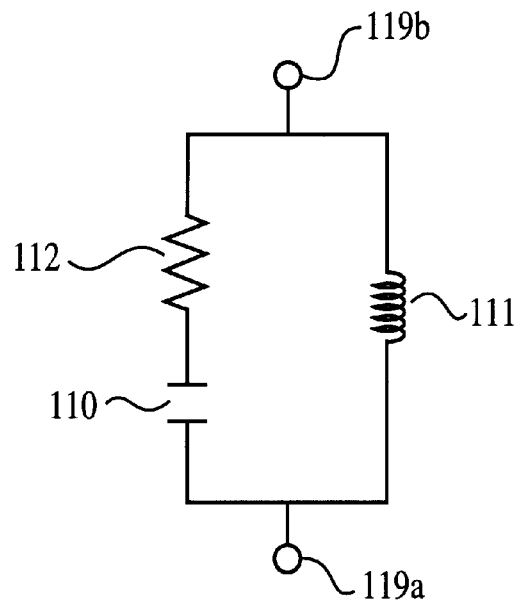
FIG. 6 is an equivalent circuit diagram to be provided by the multi-layer substrate 101 shown in FIG. 5.

FIG. 5 is a cross-sectional view schematically showing a multi-layer ceramic substrate 101 obtained by a production method according to a second preferred embodiment of the present invention. FIG. 6 is an equivalent circuit diagram provided by the multi-layer substrate 101 shown in FIG. 5.

As shown in FIG. 5, the multi-layer ceramic substrate 101 comprises a laminated member 109 having a plurality of laminated ceramic layers made of a ceramic insulating material 102, 103, 104, 105, 106, 107 and 108, and sheet type bases 148 and 149 disposed at both ends with respect to the lamination direction. The laminated member 109 accommodates a capacitor 110, an inductor 111 and a resistor 112 as the passive components. Furthermore, the laminated member 109 accommodates wiring conductors 113, 114, 115, 116, 117 and 118 for wiring the capacitor 110, the inductor 111, and the resistor 112, and further, has external terminal conductors 119a and 119b on the outer surface. Accordingly, the multi-layer ceramic substrate 101 provides a circuit as shown in FIG. 6.

Figure 7:
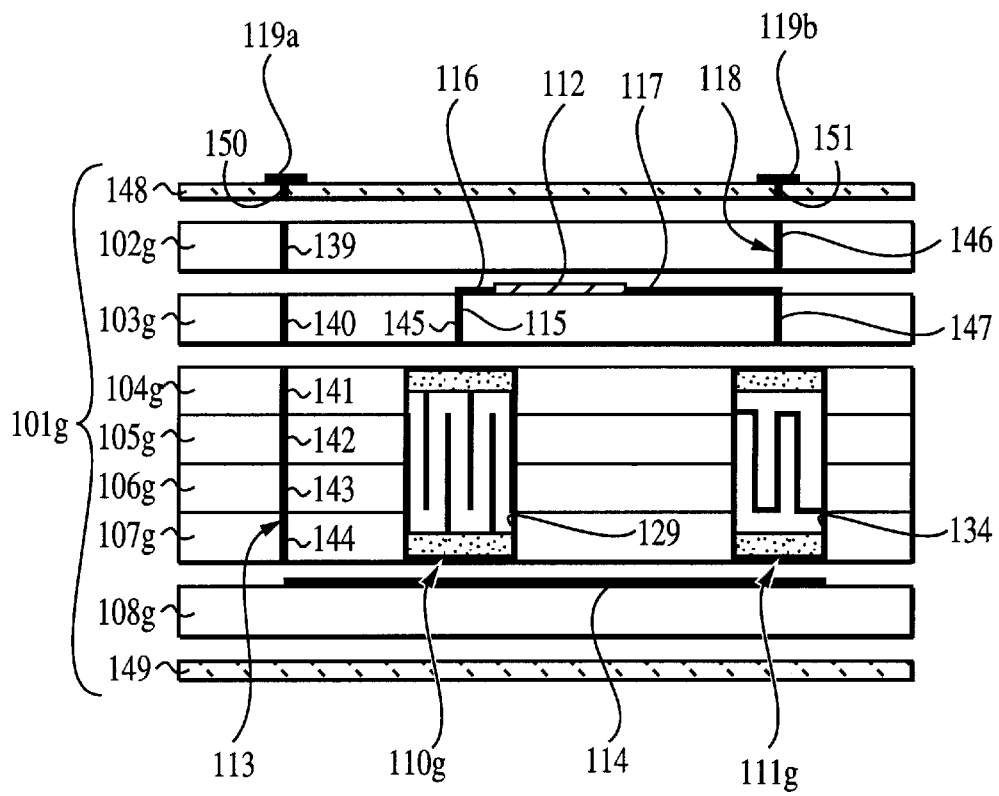
FIG. 7 is a cross-sectional view of ceramic green sheets 102g to 108g, compact blocks 110g and 111g, and sheet type bases 148 and 149 to be prepared for producing the multi-layer ceramic substrate 101, for explaining the production method of the multi-layer ceramic substrate 101 shown in FIG. 5.

The multi-layer ceramic substrate 101 with the above-mentioned configuration can be produced as follows. FIG. 7 is a cross-sectional view for explaining the production method of the multi-layer ceramic substrate 101 shown in FIG. 5. FIG. 5 is a cross-sectional view for explaining the method for obtaining a part of the elements shown in FIG. 7.

A compact block for a capacitor containing a raw ceramic functional material 110g to be the above-mentioned capacitor 110 and a compact block for an inductor containing a raw ceramic functional material 111g to be the inductor 111 are prepared, respectively.

The compact block for a capacitor 110g includes a ceramic dielectric member as the ceramic functional material so as to provide a laminated structure where multi-layer internal conductors 121 are formed via a raw dielectric sheet 120 containing the ceramic dielectric member. Terminal electrodes 122 and 123 are formed at end faces of the compact block 110 facing to each other. The internal electrodes 121 are provided such that ones to be connected with the terminal electrode 122 at one side and ones to be connected with the terminal electrode 123 at the other side are arranged alternately as in an internal electrode in a known laminated ceramic capacitor.

The compact block for an inductor 111g includes a ceramic magnetic member as the ceramic functional material so as to provide a laminated structure where multi-layer internal conductors 125 are formed via a raw magnetic sheet 124 including the ceramic magnetic member. Terminal electrodes 126 and 127 are formed at end faces of the compact block 111g facing to each other. The multi-layer internal electrodes 125 comprise a conductor path elongating in a coil-like manner while each of them is connected with a through conductor 128 for penetrating each magnetic sheet 124.

It is preferable that the compact blocks 110g and 111g can be baked at a temperature not higher than 1,000° C.

Accordingly, as the ceramic functional material to be contained in the dielectric sheet 120 and in the magnetic sheet 124, that is, as the ceramic dielectric member and the ceramic magnetic member, a crystallized glass or a mixture of a glass and a ceramic can be used advantageously. More specifically, as the dielectric sheet 120, one prepared by forming a ceramic slurry obtained by mixing powders of barium titanate containing a slight amount of a borosilicate glass and an organic vehicle into a sheet-like shape by a doctor blade method can be used. On the other hand, as the magnetic sheet 124, one prepared by forming a ceramic slurry obtained by mixing powders of nickel zinc ferrite containing a slight amount of a borosilicate glass and an organic vehicle into a sheet-like shape by a doctor blade method can be used.

As a conductor for forming the internal conductor 121, the terminal electrodes 122 and 123, the internal conductor 25, the terminal electrodes 126 and 127, and the through conductor 128, a conductive paste containing at least one selected from the group consisting of Ag, Ag—Pt alloy, Ag—Pd alloy, Au and Cu as the main component can be used advantageously.

The internal electrodes 121 and 125 can be formed by applying the above-mentioned conductive paste onto the dielectric sheet 120 and the magnetic sheet 124 with a predetermined pattern by screen printing.

In order to obtain the compact blocks 110g and 111g, it is preferable that a predetermined number of the dielectric sheets 120 where the internal conductor 121 is formed and a predetermined number of the magnetic sheets 124 where the internal conductor 125 is formed as mentioned above are laminated, and applied with a pressing step. In the pressing step, for example, a 200 kg/cm² pressure is applied by a hydraulic press.

On the other hand, the ceramic green sheets 102g, 103g, 104g, 105g, 106g, 107g and 108g to be the above-mentioned ceramic layers 102 to 108 are prepared. The ceramic insulating material to be contained in the ceramic green sheets 102g to 108g are different from the ceramic functional material to be contained in the above-mentioned compact block 110g or 111g.

Processing or treatment are preliminarily applied to the ceramic green sheets 102g to 108g for providing the compact block for a capacitor 110g and the compact block for an inductor 111g, and for providing the resistor 112, the wiring conductors 113 to 118, and the external terminal conductors 119a and 119b.

More specifically, a series of through holes 130, 131, 132 and 133 to be a space 129 for accommodating the compact block for a capacitor 110g, and a series of through holes 135, 136, 137 and 138 to be a space 134 for accommodating the compact block for an inductor 111g are provided preliminarily to the ceramic green sheets 104g, 105g, 106g and 107g.

Furthermore, a series of through holes 139, 140, 141, 142, 143 and 144 for providing the wiring conductor 113 are provided preliminarily to the ceramic green sheets 102g, 103g, 104g, 105g, 106g and 107g. A through hole 145 for providing the wiring conductor 115 is provided to the ceramic green sheet 103g. A series of through holes 146 and 147 for providing the wiring conductor 118 are preliminarily provided to the ceramic green sheets 102g and 103g. A conductive paste to be the wiring conductors 113, 115 and 118 is applied into the through holes 139 to 147.

A conductive paste to be the wiring conductors 116 and 117 is applied to the ceramic green sheet 103g by screen printing such that the conductive paste can be connected with the conductive paste in the through holes 145 and 147. A thick film resistor to be the resistor 112 is applied such that the conductive paste to be the wiring conductors 116 and 117 can be connected. As the resistor paste for forming the thick film resistor, a mixture of powders of lutetium oxide containing a slight amount of borosilicate glass and an organic vehicle can be used advantageously.

Moreover, a conductive paste to be the wiring conductor 114 is provided to the ceramic green sheet 108g by screen printing such that it is connected to the conductive paste inside the through hole 144 and is exposed in the spaces 129 and 134 when the ceramic green sheets 102g to 108g are laminated, that is, it can be connected with the terminal electrodes 123 and 127 of the compact blocks 110g and 111g.

As the ceramic insulating material to be contained in the ceramic green sheets 102g to 108g, one which can be baked at a temperature not more than 1,000° C. is preferably used. Examples thereof include a glass, and a mixture of a glass and a ceramic. In this case, the weight ratio of the glass/the ceramic can be selected in the range from 100/0 to 5/95 because a baking temperature becomes higher than 1,000° C. with a glass/ceramic weight ratio smaller than 5/95. Since a higher baking temperature narrows the range of selecting the material for the above-mentioned wiring conductor 113 to 118, it is not preferable.

More specifically, as the ceramic green sheets 102g to 108g, one prepared by forming a ceramic slurry obtained by mixing borosilicate glass powders and alumina powders with an organic vehicle in a sheet-like shape by a doctor blade method can be used. The ceramic green sheets 102g to 108g of the material can be baked at a comparatively low temperature of about 800 to 1,000° C.

On the other hand, the sheet type bases 148 and 149 to be disposed at both ends with respect to the lamination direction of the plurality of the above-mentioned ceramic green sheets 102g to 108g are prepared in the raw state. The sheet type bases 148 and 149 contain a ceramic not to be sintered at the baking temperature of the ceramic green sheets 102g to 108g and the compact blocks 110g and 111g.

For example, if the ceramic green sheets 102g to 108g and the compact blocks 110g and 111g can be baked at a temperature not more than 1,000° C., the ceramic to be contained in the sheet type bases 148 and 149 can be one not to be sintered at 1,000° C. If the ceramic green sheets 102g to 108g contain borosilicate glass powders and alumina powders as mentioned above, the sheet type bases 148 and 149 can be obtained advantageously by forming a ceramic slurry obtained by mixing ceramic powders such as alumina, zirconia, or the like, and an organic vehicle into a sheetlike shape by a doctor blade method.

Each of the sheet type bases 148 and 149 needs to be controlled adequately not only in the materials as mentioned above but also in the thickness thereof. The thickness control will be explained later with reference to FIG. 9.

A through hole 150 for providing the wiring conductor 113 is provided such that it is aligned with the through holes 139 to 144, and, a through hole 151 for providing the wiring conductor 118 is provided such that it is aligned with the through holes 146 and 147 in one of the sheet type bases 148. The inside of the through holes 150 and 151 is applied with a conductive paste to be the wiring conductors 113 and 118.

Moreover, the sheet type base 148 provided above is applied with a conductive paste to be the external terminal conductors 119a and 119b, respectively by screen printing, or the like so as to be connected with the conductive paste in the through holes 150 and 151, respectively.

As the conductive paste to be the wiring conductors 113 to 118 and the external terminal conductors 119a and 119b, one containing at least one selected from the group consisting of Ag, Ag—Pt alloy, Ag—Pd alloy, Au and Cu as the main component can be used advantageously.

With the ceramic green sheets 102g to 108g, the compact blocks 110g and 111g, and the raw sheet type bases 148 and 149 and accordingly obtained, a raw composite compact 110g. to be the multi-layer ceramic substrate 101 after baking can be produced as follows.

Figure 9:
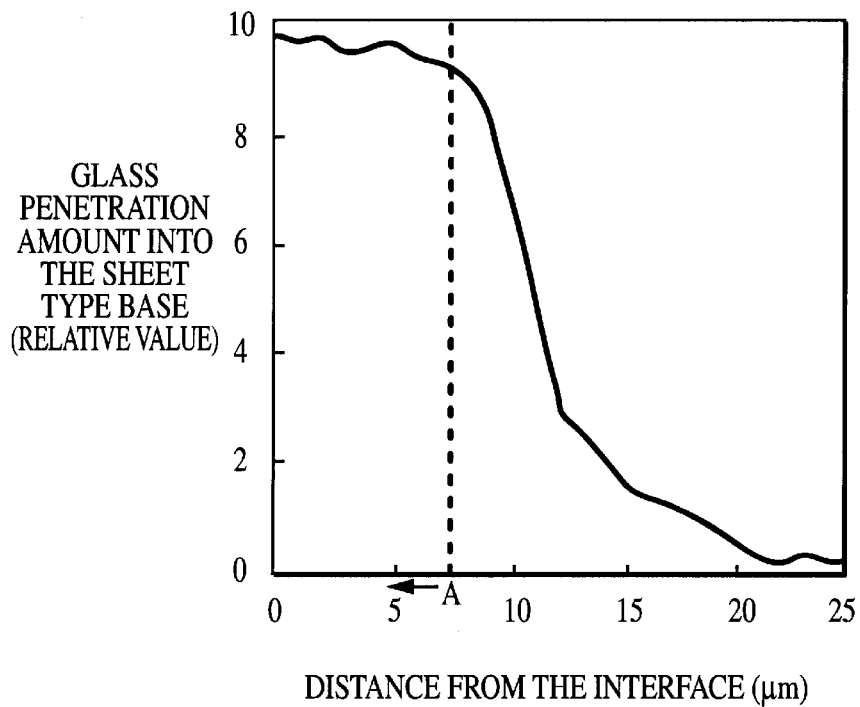
FIG. 9 is a graph showing the distribution of the penetration amount of the glass into the sheet type base baked at 850° C. in the thickness direction.

As shown in FIG. 9, the ceramic green sheets are laminated preliminarily. The, the compact blocks 110g and 111g are fitted into the spaces 129 and 134. At the time, the terminal electrodes 122, 123, 126 and 127 are exposed from the opening of the spaces 129 and 134. Then, a pressing step is conducted with, for example, a 500 kg/cm² hydraulic press so as to press the ceramic green sheets 104g to 107g. Accordingly, the closeness among the ceramic green sheets 104g to 107g can be improved as well as the compact blocks 110g and 111g and the internal periphery surface of the spaces 129 and 134 can be contacted closely.

The ceramic green sheets 102g, 103g and 108g are laminated above and below the above-mentioned ceramic green sheets 104g to 107g, and furthermore, the sheet type bases 148 and 149 are laminated thereon so as to obtain the raw composite compact 101g. In the state of the composite compact 101g, the conductive paste inside the through hole 150 and 139 to 144 forms a series of the wiring conductor 113 and is connected to the wiring conductor 114. The conductive paste in the through hole 145 is connected to the terminal electrode 122 of the compact block 110g. The conductive paste in the through holes 151, 146 and 147 forms a series of the wiring conductor 118 and is connected to the terminal electrode 126 of the compact block 111g. The terminal electrodes 123 and 127 of the compact blocks 110g and 111g are connected to the wiring conductor 114.

When the raw composite compact 101g is obtained accordingly, the raw composite compact 101g is pressed in the lamination direction. For the pressing operation, for example, a 1,000 kg/cm² hydraulic press can be used.

The raw composite compact 101g is baked, for example, in the air at 900° C. It is preferable to apply a load of 10 kg/cm² or not more than 10 kg/cm² in the lamination direction in the baking step by placing a plate-like weight on the sheet type base 148 provided above because undesired deformation of the laminated member 109 or the multi-layer ceramic substrate 101 to be obtained such as warpage can be avoided advantageously by the load in the baking step. Since the effect of a load more than 10 kg/cm² is substantially the same as the case of a 10 kg/cm² load, a load more than 10 kg/cm² is not necessary.

By the baking operation, the compact blocks 110g and 111g are baked so as to be the capacitor 110 and the inductor 111 in the sintered state, and the ceramic green sheets 102g to 108g are baked so as to obtain a plurality of ceramic layers 102 to 108 in the sintered state.

As mentioned above, the sheet type bases 148 and 149 contain a ceramic not to be sintered at the baking temperature of the ceramic green sheets 102g to 108g and the compact blocks 110g and 111g. Therefore, the sheet type bases 148 and 149 do not generate substantial contraction in the baking step. Accordingly, the contraction of the ceramic green sheets 102g to 108g interposed between the sheet type bases 148 and 149 in the X-Y direction, that is, in the principal plane direction can be advantageously restrained at the time of baking. Therefore, a higher size accuracy of the multi-layer ceramic substrate 101 can be achieved, and thus problems such as disconnection can further be prevented even if minute high density wiring is applied to the wiring conductors 113 to 118. According to an experiment, it was confirmed that the capacitor 110, the inductor 111 and the resistor 112 show the designed characteristics.

Furthermore, as mentioned above, since the contraction is restrained in the X-Y direction, the contraction behavior of the compact blocks 110g and 111g and the ceramic green sheets 102g to 108g can be coincided with each other more easily at the time of baking the compact blocks 110g and 111g and the ceramic green sheets 102g to 108g at the same time in baking the composite compact 101g. Therefore, the materials for the compact blocks 110g and 111g and the ceramic green sheets 102g to 108g can be selected from a further wider range.

The sheet type bases 148 and 149 are used as the surface layer of the multi-layer ceramic substrate after the baking step without eliminating. In order to achieve this, the thickness of the sheet type bases 148 and 149 is controlled to be thin. They are provided with a thickness not sufficient for completely filling a gap part by the penetration of the material comprising the ceramic green sheets 102g to 108g when baked in the state contacting with the ceramic green sheets 102g and 108g at the lowest temperature for completely sintering the ceramic green sheets. At the time of baking the raw composite compact 101g, it is based at a temperature higher than the lowest sintering temperature of the ceramic green sheets 102g to 108g so as to completely fill the gap part of the sheet type bases 148 and 149 with the material comprising the ceramic green sheets 102g to 108g. The details of the thickness of the sheet type bases 148 and 149 as mentioned above will be explained hereinafter with reference to FIG. 9.

FIG. 9 shows the distribution state of the penetration amount of the glass in the ceramic green sheets into the sheet type base in the thickness direction when the ceramic green sheet containing the glass is baked at 850° C. in the state contacting with the sheet type base. In FIG. 9, the vertical axis represents the glass penetration amount into the sheet type base, and the horizontal axis represents the distance from the interface between the sheet type base and the ceramic green sheet or the ceramic layer in the sheet type base.

Since the organic component is combusted and evaporated in the degreasing process in the baking step, the sheet type base becomes porous, and the glass in the ceramic green sheet penetrates to the gap part of the sheet type base at the time of baking. At the time, the gap part is sufficiently filled with the glass in the vicinity of the interface with the ceramic green sheet, and as it is farther from the interface, the glass penetration amount reduces. Therefore, if a sheet type base thinner than the thickness shown as A in FIG. 9 is used, since the sheet type base obtains a dense structure with the gap part thereof sufficiently filled with the glass by baking, it can be used as a member comprising the surface layer of the multi-layer ceramic substrate after baking.

On the other hand, the glass penetration to the gap part of the sheet type base takes place simultaneously or after the ceramic green sheet contraction in the thickness direction in the baking step. However, since the force of the sheet type base to restrain the contraction of the ceramic green sheet in the X-Y direction is lowered if the gap part of the sheet type base is filled with the glass before the ceramic green sheet contraction in the thickness direction is completed, the thickness of the sheet type base needs to have a size sufficient for not having the gap part of the sheet type base being filled completely with the glass before the ceramic green sheet contraction in the thickness direction is completed.

Accordingly, the sheet type base is provided with a thickness sufficient for not having the gap part being filled by the glass penetration at the lowest temperature for completely sintering the ceramic green sheet so that the gap part of the sheet type base can be adjusted to be filled with the glass completely by setting the highest temperature of baking and the maintenance time thereof adequately after finishing the ceramic green sheet, that is, the ceramic layer contraction in the thickness direction in the baking step.

Furthermore, since the thickness appropriate for the sheet type base differs according to the composition, the amount ratio and the particle size of the glass or the ceramic used in the ceramic green sheet, or the fine structure comprising the sheet type base, or the like, a thickness appropriate for the sheet type base is determined by examining the distribution of the glass penetration amount into the sheet type base as shown in FIG. 9.

As a complementary explanation, since a partial insufficiency with respect to the glass penetration amount is caused if the thickness of the sheet type base is too large, the risk of peel-off or a poor strength after baking is generated. Therefore, it is necessary to restrain the sheet type base thickness irregularity to a small degree. For example, one formed like a sheet by a doctor blade can have the thickness irregularity within 2%, the doctor blade method can be used advantageously for obtaining the sheet type base.

A preferable method for setting the baking profile will be explained concretely with reference to FIG. 10.

Figure 10:
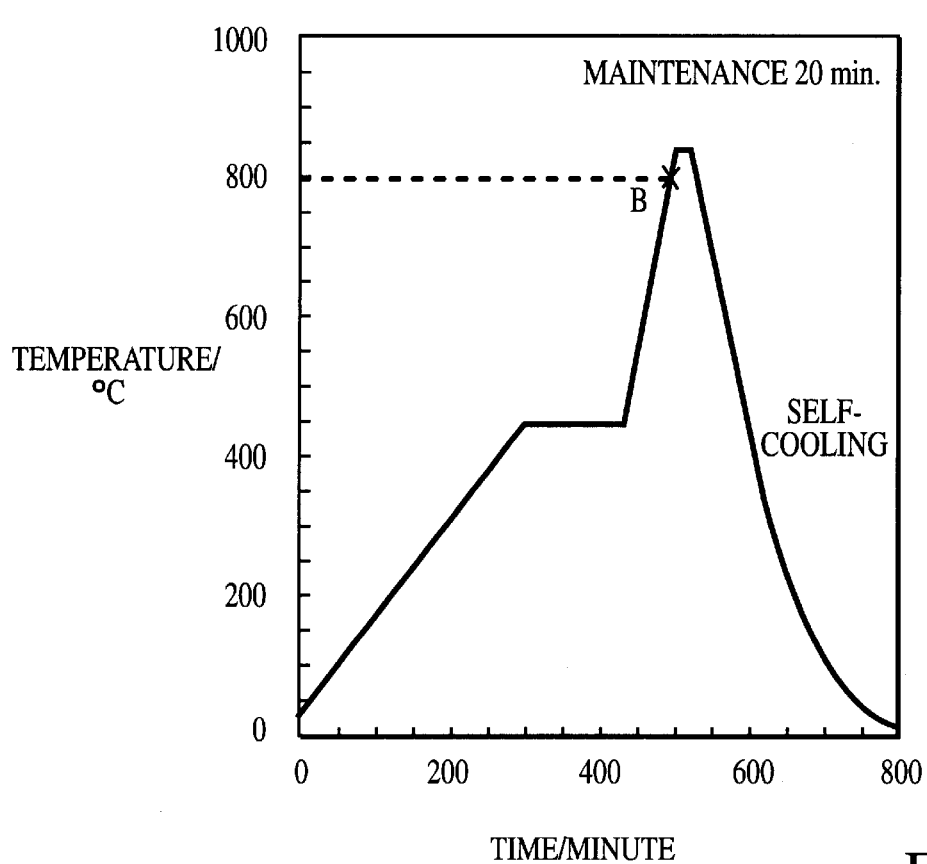
FIG. 10 is a graph showing a preferable example of a baking profile.

FIG. 10 shows a concrete example of a baking profile.

In FIG. 6, the point B represents the point where the contraction of the ceramic green sheet or the ceramic layer in the thickness direction is completed, which was confirmed by a preliminary experiment. Moreover, it was confirmed that when the temperature was dropped from the point B to the room temperature, using a sheet type base having a 5 $\mu$m thickness, the glass was penetrated in the sheet type base by about 1 $\mu$m in the thickness direction from the ceramic layer side. On the other hand, the baking profile shown in FIG. 10 has a temperature higher than the point B by 50° C. as the highest temperature, and a 20 minutes maintenance time. By sintering the same specimen with the profile of FIG. 10, the sheet type base became dense by the glass penetrated from the ceramic layer side, and the contraction ratio by baking was 0.2% or less. Accordingly, by baking at a temperature higher (for example, the highest temperature higher by 50° C.) than the lowest temperature (point B) for completely sintering the ceramic green sheet, the gap part of the sheet type base can be filled completely with the glass so that the sheet type base can be dense.

Moreover, although the baking profile as mentioned above needs to be changed according to the materials of the ceramic green sheet and the sheet type base, the thickness of the sheet type base, or the like, in general, it is preferable to set the highest temperature higher than the temperature of completing the ceramic layer contraction in the thickness direction by 10 to 100° C., and the maintenance time for about 10 to 100 minutes.

Accordingly, by setting the highest temperature and the maintenance time in the baking step, that is, the baking profile and the thickness of the sheet type base appropriately, an undesired result such as failure in obtaining a sufficiently dense sheet type base, and too large contraction by the gap part of the sheet type base being filled with the glass before the ceramic layer contraction in the thickness direction is completed, can be avoided.

In the laminated member 109 of the multi-layer ceramic substrate 101 after baking accordingly obtained, the heat expansion coefficient of the sheet type base 148 and 149 parts is preferably smaller than the heat expansion coefficient of the ceramic layer 102 to 108 parts by not less than $0.5 \times 10^{-6}$ degK$^1$ but not more than $4.5 \times 10^{-6}$ degK$^{-1}$. The reason is as follows.

It is because it was found out that an appropriate compressive stress can be generated at the surface part of the laminated member 109 after baking by adjusting the heat expansion coefficient as mentioned above, and the laminated member 109 in the state has an improved mechanical strength compared with one in the state not having the compressive stress in the surface part.

According to an experiment, compared with one in the state not having the compressive stress in the surface part, one having the compressive stress generated has 1.1 to 1.6 times of the transverse rupture resistance strength. Moreover, with respect to the surface layer part and the other inner layer part, if the heat expansion coefficient of the former is smaller than that of the latter by more than $4.5 \times 10^{-6}$ degK$^{-1}$, since the compressive stress generated in the surface layer part becomes too large, the strength was declined conversely.

Accordingly, as to the heat expansion coefficient difference between the surface layer part and the other inner layer part, the above-mentioned appropriate range exists. Moreover, the heat expansion coefficients of the surface layer part (sheet type bases 148 and 149) and the other inner layer part (ceramic layers 102 to 108) were found out by shaving each part from the obtained multi-layer ceramic substrate 101 by an abrasion method, cutting the same into about 2 mm square, and measuring the relationship between the temperature and the size with a high temperature microscope.

Figure 8:
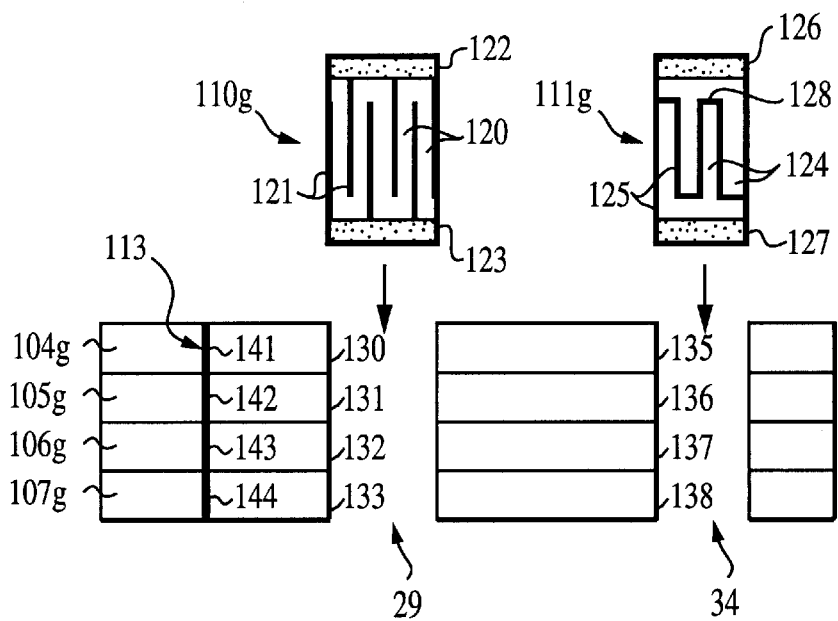
FIG. 8 is a cross-sectional view showing the ceramic green sheets 104g to 107g and the compact blocks 110g and 111g shown in FIG. 7 separately.
Figure 11:
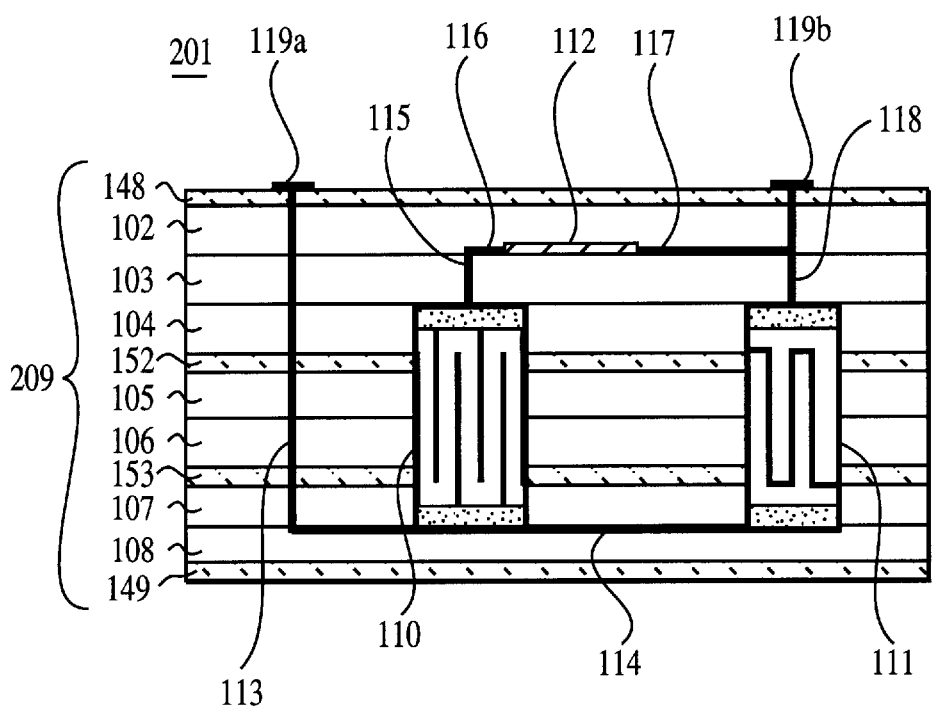
FIG. 11 is a diagram corresponding with FIG. 5, for explaining the third preferred embodiment of the present invention.
Figure 12:
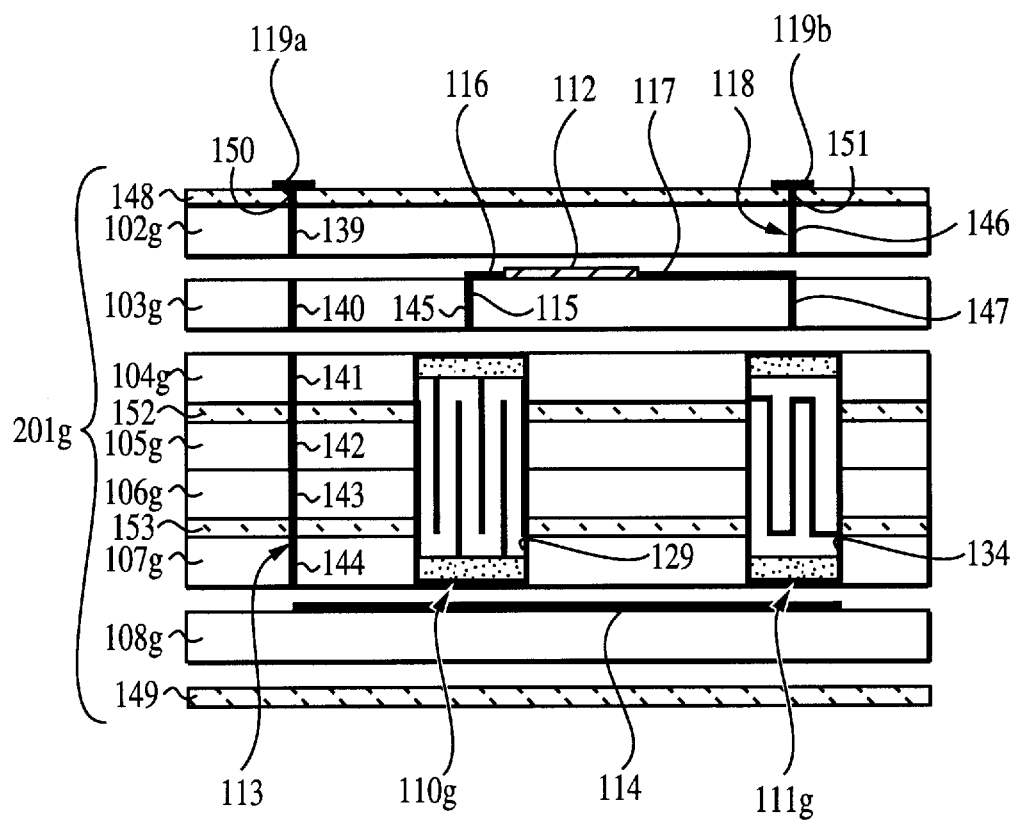
FIG. 12 is a diagram corresponding with FIG. 7, showing the embodiment shown in FIG. 11.
Figure 13:
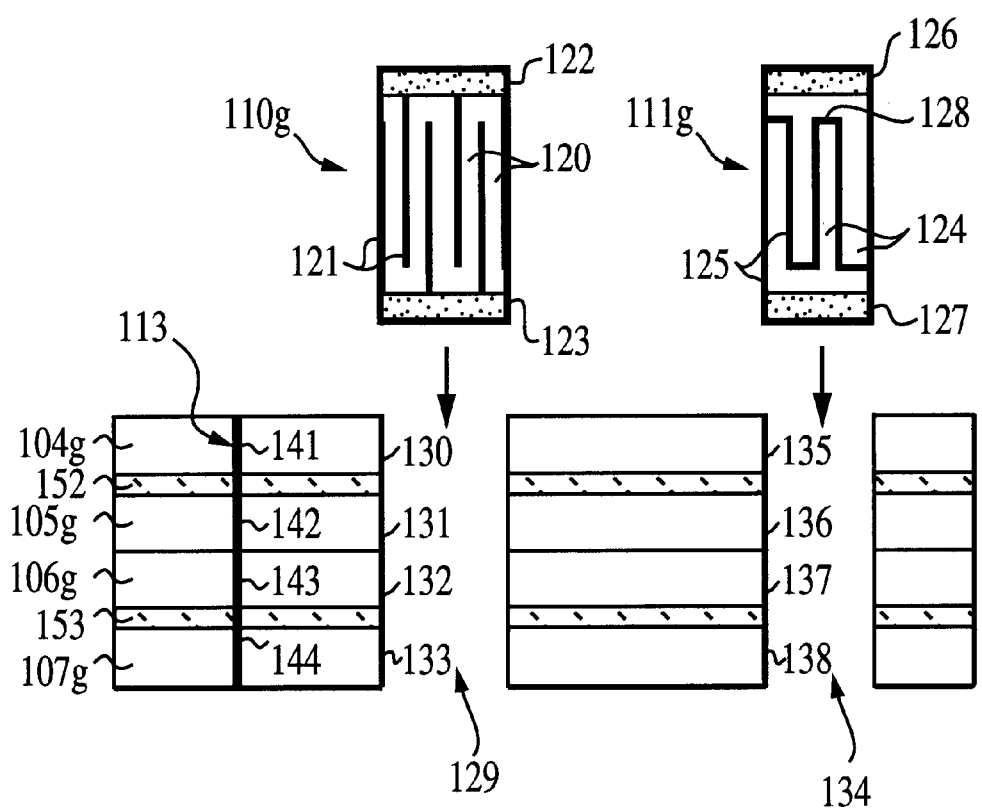
FIG. 13 is a diagram corresponding with FIG. 8, showing the embodiment shown in FIG. 11.

FIGS. 11, 12 and 13 are diagrams, corresponding with FIGS. 5, 7 and 8, for explaining a third preferred embodiment of the present invention. In FIGS. 11 to 13, the elements corresponding with those shown in FIGS. 5, 7 and 8 are applied with the same reference numerals and a redundant explanation is omitted. Hereinafter, the configuration specific to this embodiment will be explained.

A laminated member 209 comprising a multi-layer ceramic substrate 201 according to this embodiment is characterized in comprising, in addition to the sheet type bases 148 and 149, sheet type bases 152 and 153 with the same composition and the same function. The sheet type bases 152 and 153 are disposed at the center part with respect to the lamination direction of the laminated member 209, respectively. Therefore, also in a raw composite compact 201g to be produced in the production process of the multi-layer ceramic substrate 201 shown in FIGS. 12 and 13, the raw sheet type bases 152 and 153 are disposed at the center part with respect to the lamination direction thereof.

As to the other configuration, it is substantially the same as the above-mentioned embodiment.

According to the third embodiment, compared with the second embodiment, a multi-layer ceramic substrate 201 with a higher size accuracy can be obtained. That is, since a means for achieving the function of restraining the contraction by baking is not provided at the center part with respect to the lamination direction of the composite compact 1g if the sheet type bases 148 and 149 are disposed only at both ends with respect to the lamination direction of the composite compact 101g as in the above-mentioned embodiment, the contraction may generate at the center part. This can be generated more easily with a thicker composite compact 101g, or with thinner sheet type bases 148 and 149. On the other hand, since the contraction in the center part can also be restrained securely by providing the sheet type bases 152 and 153 at the center part with respect to the lamination direction of the composite compact 201g as in this embodiment, as a result, the size accuracy of the baked multi-layer ceramic substrate 201 can further be improved.

Furthermore, when the sheet type bases 152 and 153 are disposed at the center part with respect to the lamination direction of the composite compact 201g as in this embodiment, it is preferable to provide the sheet type bases 152 and 153 symmetrically as much as possible with respect to the lamination direction and in a plurality.

Although the present invention has been explained with reference to the embodiment shown in the drawings, various modification can be adopted within the range of the invention.

For example, the sheet type bases can be provided only at the center part with respect to the lamination direction of the composite laminated member without providing at both end parts.

For example, the circuit design adopted in the multi-layer ceramic substrate 101 shown in the drawings is merely a typical example for facilitating understanding of the present invention, and thus the present invention can be adopted equally in multi-layer ceramic substrates having various kinds of circuit designs.

Moreover, the compact blocks are not limited to a single member of a capacitor or an inductor, but a compact block of LC composite parts can be used as well.

Furthermore, although the spaces 129 and 134 for fitting the compact blocks 110g and 111g are provided as the through holes 130 to 133 and 135 to 138, or the like, in the ceramic green sheets 104g to 107g in the above-mentioned embodiments, a space for fitting a compact block can be formed as a concave part provided in a specific ceramic green sheet depending upon the size or the shape of the compact block.

Moreover, although the passive components 110 and 111 stored in the laminated member 109 are provided by the compact blocks 110g and 111g containing a raw ceramic functional material, respectively, and the compact blocks 110g and 111g are fitted into the spaces 129 an 134 preliminarily provided in the raw composite compact 101g in the illustrated production method of a multi-layer ceramic substrate 101, or the like, a passive component can be provided by a second ceramic green sheet containing a ceramic functional material, which is different from the ceramic insulating material, to be interposed between the laminated first ceramic green sheets containing the ceramic insulating material.

Furthermore, the present invention can be adopted advantageously also to a production method of a multi-layer ceramic substrate comprising a laminated member, simply with a wiring conductor formed therein, without storing the above-mentioned passive component.

While the invention has been particularly shown and described with reference to preferred embodiments thereof, it will be understood by those skilled in the art that the forgoing and other changes in form and details may be made therein without departing from the spirit of the invention.

What is claimed is:

1. A method of producing a multi-layer ceramic substrate comprising a laminated member having a plurality of ceramic layers made of a ceramic insulating material and a wiring conductor, comprising the steps of:

preparing a plurality of ceramic green sheets containing the ceramic insulating material;

preparing at least one raw sheet base containing a ceramic not to be sintered at the baking temperature of the ceramic green sheets, and having a sufficient thickness such that the filling of a gap part, said gap part being formed in the raw sheet base by baking, by the penetration of a material comprising the ceramic green sheets, is not completed at the lowest temperature for completely sintering the ceramic green sheets when being baked in the state contacting with the ceramic green sheets;

producing a raw composite compact comprising the plurality of the laminated ceramic green sheets, the raw sheet base to be disposed in the state contacting with at least one of the ceramic green sheets, and the wiring conductor, by using the ceramic green sheets and the raw sheet base; and baking the raw composite compact at a temperature higher than the lowest sintering temperature of the ceramic green sheets such that the gap part of the raw sheet base is filled completely with the material comprising the ceramic green sheets so as to obtain the laminated member.

2. A method of producing a multi-layer ceramic substrate comprising a laminated member having a plurality of ceramic layers made of a ceramic insulating material and a wiring conductor, and a passive component formed by the wiring conductor and enclosed in the laminated member, comprising the steps of:

preparing a plurality of first ceramic green sheets containing the ceramic insulating material and at least one second ceramic green sheet containing a raw ceramic functional material to be the passive component, which is different from the ceramic insulating material, preparing at least one raw sheet base containing a ceramic not to be sintered at the baking temperature of the first and second ceramic green sheets, and having a sufficient thickness such that the filling of a gap part, said gap part being formed in the raw sheet base by baking, by the penetration of a material comprising the ceramic green sheets in the contacting state, is not completed at the lowest temperature for completely sintering the first and second ceramic green sheets when being baked in the state contacting with at least one of the first and second ceramic green sheets;

producing a raw composite compact comprising the plurality of the first laminated ceramic green sheets, and the at least one second ceramic green sheet, the raw sheet base to be disposed in the state contacting with at least one of the first and second ceramic green sheets, and the wiring conductor, using the first and second ceramic green sheets and the raw sheet base; and baking the raw composite compact at a temperature higher than the lowest sintering temperature of the first and second ceramic green sheets such that the gap part of the raw sheet base is filled completely with the material comprising the ceramic green sheets in the state contacting therewith so as to obtain the laminated member.

3. A method of producing a multi-layer ceramic substrate comprising a laminated member having a plurality of ceramic layers made of a ceramic insulating material and a wiring conductor, and a passive component formed by the wiring conductor and enclosed in the laminated member, comprising the steps of:

preparing a plurality of ceramic green sheets containing the ceramic insulating material and a compact block containing a raw ceramic functional material to be the passive component, which is different from the ceramic insulating material, preparing at least one raw sheet base containing a ceramic not to be sintered at the baking temperature of the ceramic green sheets and the compact block, and having a sufficient thickness such that the filling of a gap part, said gap part being formed in the raw sheet base by baking, by the penetration of a material comprising the ceramic green sheets, is not completed at the lowest temperature for completely sintering the ceramic green sheets when being baked in the state contacting with the ceramic green sheets;

producing a raw composite compact comprising the plurality of the laminated ceramic green sheets, the raw sheet base to be disposed in the state contacting with at least one of the ceramic green sheets, and the wiring conductor, by using the ceramic green sheets, the raw sheet base and the compact block; and baking the raw composite compact at a temperature higher than the lowest sintering temperature of the ceramic green sheets such that the gap part of the raw sheet base is filled completely with the material comprising the ceramic green sheets so as to obtain the laminated member.

4. The method of producing a multi-layer ceramic substrate according to claims 2 or 3, wherein at least one of a capacitor and an inductor is provided by said baking step.

5. The method of producing a multi-layer ceramic substrate according to any of claims 2 and 3, wherein the second ceramic green sheet or the compact block has a laminated structure comprising a multi-layer internal conductor.

6. The method of producing a multi-layer ceramic substrate according to claim 5, wherein the internal conductor contains at least one metal selected from the group consisting of Ag, Ag—Pt alloy, Ag—Pd alloy, Au, and Cu as the main component.

7. The method of producing a multi-layer ceramic substrate according to any of claims 2 and 3, wherein the ceramic functional material contains a crystallized glass or a mixture of a glass and a ceramic.

8. The method of producing a multi-layer ceramic substrate according to any of claims 1 to 3, wherein the raw sheet base is disposed at both ends with respect to the lamination direction of the composite compact.

9. The method of producing a multi-layer ceramic substrate according to any of claims 1 to 3, wherein the raw sheet base is disposed at the center part with respect to the lamination direction of the composite compact.

10. The method of producing a multi-layer ceramic substrate according to any of claims 1 to 3, wherein the raw sheet base is disposed at both ends and the center part with respect to the lamination direction of the composite compact.

11. The method of producing a multi-layer ceramic substrate according to any of claims 1 to 3, wherein the composite compact is baked at a temperature not more than 1,000° C.

12. The method of producing a multi-layer ceramic substrate according to claim 11, wherein the ceramic insulating material contains a crystallized glass or a mixture of a glass and a ceramic, with the weight ratio of the glass and the ceramic in a range from 100/0 to 5/95.

13. The method of producing a multi-layer ceramic substrate according to claim 12, wherein the raw sheet base contains at least one ceramic selected from the group consisting of alumina and zirconia.

14. The method of producing a multi-layer ceramic substrate according to claim 13, wherein the wiring conductor contains at least one metal selected from the group consisting of Ag, Ag—Pt alloy, Ag—Pd alloy, Au, and Cu as the main component.

15. The method of producing a multi-layer ceramic substrate according to claim 11, wherein the raw sheet base contains at least one ceramic selected from the group consisting of alumina and zirconia.

16. The method of producing a multi-layer ceramic substrate according to any of claims 1 to 3, wherein a load of not more than 10 kg/cm$^2$ is applied in the lamination direction in the step of baking the raw composite compact.

17. The method of producing a multi-layer ceramic substrate according to any of claims 1 to 3, wherein the heat expansion coefficient of the raw sheet base is smaller than the heat expansion coefficient of the ceramic layer by not less than $0.5 \times 10^{-6}$ degK$^{-1}$ but not more than $4.5 \times 10^{-6}$ degK$^{-1}$ in the laminated member obtained by the baking step.

* * * * *